US008668776B2

(12) United States Patent
Chen et al.

(10) Patent No.: US 8,668,776 B2
(45) Date of Patent: *Mar. 11, 2014

(54) GAS DELIVERY APPARATUS AND METHOD FOR ATOMIC LAYER DEPOSITION

(75) Inventors: Ling Chen, Sunnyvale, CA (US); Vincent Ku, San Jose, CA (US); Dien-Yeh Wu, San Jose, CA (US); Hua Chung, San Jose, CA (US); Alan Ouye, San Mateo, CA (US); Norman Nakashima, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 671 days.

This patent is subject to a terminal disclaimer.

(21) Appl. No.: 12/797,999

(22) Filed: Jun. 10, 2010

(65) Prior Publication Data
US 2010/0247767 A1    Sep. 30, 2010

Related U.S. Application Data

(63) Continuation of application No. 11/077,753, filed on Mar. 11, 2005, now Pat. No. 7,780,788, which is a continuation of application No. 10/032,284, filed on Dec. 21, 2001, now Pat. No. 6,916,398.

(60) Provisional application No. 60/346,086, filed on Oct. 26, 2001.

(51) Int. Cl.
*C23C 16/00* (2006.01)
*H01L 21/306* (2006.01)

(52) U.S. Cl.
USPC ..................................... 118/715; 156/345.33

(58) Field of Classification Search
USPC .......... 118/715; 156/345.33, 345.34
See application file for complete search history.

(56) References Cited

U.S. PATENT DOCUMENTS

| 3,291,456 A | 12/1966 | Deane |
| 4,058,430 A | 11/1977 | Suntola et al. |

(Continued)

FOREIGN PATENT DOCUMENTS

| CN | 1244037 A | 2/2000 |
| DE | 19627017 | 1/1997 |

(Continued)

OTHER PUBLICATIONS

European Search Report dated Sep. 23, 2005 from European Application No. 03257169.7.

(Continued)

*Primary Examiner* — Karla Moore
(74) *Attorney, Agent, or Firm* — Patterson & Sheridan, LLP

(57) ABSTRACT

Apparatus and method for forming thin layers on a substrate are provided. A processing chamber has a gas delivery assembly that comprises a lid with a cap portion and a covering member that together define an expanding channel at a central portion of the lid, the covering member having a tapered bottom surface extending from the expanding channel to a peripheral portion of the covering member. Gas conduits are coupled to the expanding channel and positioned at an angle from a center of the expanding channel to form a circular gas flow through the expanding channel. The bottom surface of the chamber lid is shaped and sized to substantially cover the substrate receiving surface. One or more valves are coupled to the passageway, and one or more gas sources are coupled to each valve. A choke is disposed on the chamber lid adjacent a perimeter of the tapered bottom surface.

14 Claims, 7 Drawing Sheets

(56) References Cited

U.S. PATENT DOCUMENTS

| | | | |
|---|---|---|---|
| 4,389,973 | A | 6/1983 | Suntola et al. |
| 4,413,022 | A | 11/1983 | Suntola et al. |
| 4,415,275 | A | 11/1983 | Dietrich |
| 4,486,487 | A | 12/1984 | Skarp et al. |
| 4,614,639 | A | 9/1986 | Hegedus |
| 4,732,110 | A | 3/1988 | Parsons |
| 4,761,269 | A | 8/1988 | Conger et al. |
| 4,767,494 | A | 8/1988 | Kobayashi et al. |
| 4,806,321 | A | 2/1989 | Nishizawa et al. |
| 4,813,846 | A | 3/1989 | Helms et al. |
| 4,825,809 | A * | 5/1989 | Mieno ..................... 118/725 |
| 4,829,022 | A | 5/1989 | Kobayashi et al. |
| 4,834,831 | A | 5/1989 | Nishizawa et al. |
| 4,838,983 | A | 6/1989 | Schumaker et al. |
| 4,838,993 | A | 6/1989 | Aoki et al. |
| 4,840,921 | A | 6/1989 | Matsumoto |
| 4,845,049 | A | 7/1989 | Sunakawa |
| 4,859,625 | A | 8/1989 | Matsumoto |
| 4,859,627 | A | 8/1989 | Sunakawa et al. |
| 4,861,417 | A | 8/1989 | Mochizuki et al. |
| 4,876,218 | A | 10/1989 | Pessa et al. |
| 4,907,534 | A | 3/1990 | Huang et al. |
| 4,917,556 | A | 4/1990 | Stark et al. |
| 4,927,670 | A | 5/1990 | Erbil |
| 4,931,132 | A | 6/1990 | Aspnes et al. |
| 4,951,601 | A | 8/1990 | Maydan et al. |
| 4,960,720 | A | 10/1990 | Shimbo et al. |
| 4,975,252 | A | 12/1990 | Nishizawa et al. |
| 4,987,856 | A | 1/1991 | Hey et al. |
| 4,991,542 | A | 2/1991 | Kohmura et al. |
| 4,993,357 | A | 2/1991 | Scholz et al. |
| 5,000,113 | A | 3/1991 | Wang et al. |
| 5,013,683 | A | 5/1991 | Petroff et al. |
| 5,027,746 | A | 7/1991 | Frijlink et al. |
| 5,028,565 | A | 7/1991 | Chang et al. |
| 5,082,798 | A | 1/1992 | Arimoto et al. |
| 5,085,885 | A | 2/1992 | Foley et al. |
| 5,085,887 | A | 2/1992 | Adams et al. |
| 5,091,320 | A | 2/1992 | Aspnes et al. |
| 5,130,269 | A | 7/1992 | Kitahara et al. |
| 5,134,965 | A | 8/1992 | Tokuda et al. |
| 5,166,092 | A | 11/1992 | Mochizuki et al. |
| 5,173,327 | A | 12/1992 | Sandhu et al. |
| 5,173,474 | A | 12/1992 | Connell et al. |
| 5,178,681 | A | 1/1993 | Moore et al. |
| 5,186,718 | A | 2/1993 | Tepman et al. |
| 5,204,145 | A | 4/1993 | Gasworth |
| 5,205,077 | A | 4/1993 | Wittstock et al. |
| 5,221,449 | A | 6/1993 | Colgan et al. |
| 5,224,513 | A | 7/1993 | Bertone |
| 5,225,366 | A | 7/1993 | Yoder |
| 5,229,081 | A * | 7/1993 | Suda ..................... 422/186 |
| 5,234,561 | A | 8/1993 | Randhawa et al. |
| 5,246,536 | A | 9/1993 | Nishizawa et al. |
| 5,250,148 | A | 10/1993 | Nishizawa et al. |
| 5,254,207 | A | 10/1993 | Nishizawa et al. |
| 5,256,244 | A | 10/1993 | Ackerman |
| 5,259,881 | A | 11/1993 | Edwards et al. |
| 5,261,959 | A | 11/1993 | Gasworth |
| 5,264,038 | A | 11/1993 | Hara et al. |
| 5,270,247 | A | 12/1993 | Sakuma et al. |
| 5,278,435 | A | 1/1994 | Van Hove et al. |
| 5,281,274 | A | 1/1994 | Yoder |
| 5,281,485 | A | 1/1994 | Colgan et al. |
| 5,286,296 | A | 2/1994 | Sato et al. |
| 5,290,748 | A | 3/1994 | Knuuttila et al. |
| 5,294,286 | A | 3/1994 | Nishizawa et al. |
| 5,296,403 | A | 3/1994 | Nishizawa et al. |
| 5,300,186 | A | 4/1994 | Kitahara et al. |
| 5,306,666 | A | 4/1994 | Izumi et al. |
| 5,311,055 | A | 5/1994 | Goodman et al. |
| 5,316,615 | A | 5/1994 | Copel et al. |
| 5,316,793 | A | 5/1994 | Wallace et al. |
| 5,330,610 | A | 7/1994 | Eres et al. |
| 5,336,324 | A | 8/1994 | Stall et al. |
| 5,338,362 | A | 8/1994 | Imahashi et al. |
| 5,338,363 | A | 8/1994 | Kawata et al. |
| 5,338,364 | A | 8/1994 | Kurihara et al. |
| 5,338,389 | A | 8/1994 | Nishizawa et al. |
| 5,348,911 | A | 9/1994 | Jurgensen et al. |
| 5,374,570 | A | 12/1994 | Nasu et al. |
| 5,395,791 | A | 3/1995 | Cheng et al. |
| 5,438,952 | A | 8/1995 | Otsuka et al. |
| 5,439,876 | A | 8/1995 | Graf et al. |
| 5,441,703 | A | 8/1995 | Jurgensen et al. |
| 5,443,033 | A | 8/1995 | Nishizawa et al. |
| 5,443,647 | A | 8/1995 | Aucoin et al. |
| 5,455,072 | A | 10/1995 | Bension et al. |
| 5,458,084 | A | 10/1995 | Thorne et al. |
| 5,469,806 | A | 11/1995 | Mochizuki et al. |
| 5,480,818 | A | 1/1996 | Matsumoto et al. |
| 5,483,919 | A | 1/1996 | Yokoyama et al. |
| 5,484,664 | A | 1/1996 | Kitahara et al. |
| 5,496,410 | A | 3/1996 | Fukuda et al. |
| 5,503,875 | A | 4/1996 | Imai et al. |
| 5,521,126 | A | 5/1996 | Okamura et al. |
| 5,527,733 | A | 6/1996 | Nishizawa et al. |
| 5,532,511 | A | 7/1996 | Nishizawa et al. |
| 5,540,783 | A | 7/1996 | Eres et al. |
| 5,542,452 | A | 8/1996 | Carver, Jr. et al. |
| 5,558,717 | A | 9/1996 | Zhao et al. |
| 5,573,566 | A | 11/1996 | Anderberg et al. |
| 5,580,380 | A | 12/1996 | Liu et al. |
| 5,580,421 | A | 12/1996 | Hiatt et al. |
| 5,601,651 | A | 2/1997 | Watabe et al. |
| 5,609,689 | A | 3/1997 | Kato et al. |
| 5,616,181 | A | 4/1997 | Yamamoto et al. |
| 5,637,530 | A | 6/1997 | Gaines et al. |
| 5,641,984 | A | 6/1997 | Aftergut et al. |
| 5,643,366 | A | 7/1997 | Somekh et al. |
| 5,644,128 | A | 7/1997 | Wollnik et al. |
| 5,667,592 | A | 9/1997 | Boitnott et al. |
| 5,674,786 | A | 10/1997 | Turner et al. |
| 5,693,139 | A | 12/1997 | Nishizawa et al. |
| 5,695,564 | A | 12/1997 | Imahashi et al. |
| 5,705,224 | A | 1/1998 | Murota et al. |
| 5,707,880 | A | 1/1998 | Aftergut et al. |
| 5,711,811 | A | 1/1998 | Suntola et al. |
| 5,730,801 | A | 3/1998 | Tepman et al. |
| 5,730,802 | A | 3/1998 | Ishizumi et al. |
| 5,747,113 | A | 5/1998 | Tsai |
| 5,749,974 | A | 5/1998 | Habuka et al. |
| 5,788,447 | A | 8/1998 | Yonemitsu et al. |
| 5,788,799 | A | 8/1998 | Steger et al. |
| 5,796,116 | A | 8/1998 | Nakata et al. |
| 5,801,634 | A | 9/1998 | Young et al. |
| 5,804,488 | A | 9/1998 | Shih et al. |
| 5,807,792 | A | 9/1998 | Ilg et al. |
| 5,830,270 | A | 11/1998 | McKee et al. |
| 5,834,372 | A | 11/1998 | Lee et al. |
| 5,835,677 | A | 11/1998 | Li et al. |
| 5,838,677 | A | 11/1998 | Kozaki et al. |
| 5,846,330 | A | 12/1998 | Quirk et al. |
| 5,846,332 | A | 12/1998 | Zhao et al. |
| 5,851,849 | A | 12/1998 | Comizzoli et al. |
| 5,855,675 | A | 1/1999 | Doering et al. |
| 5,855,680 | A | 1/1999 | Soininen et al. |
| 5,856,219 | A | 1/1999 | Naito et al. |
| 5,858,102 | A | 1/1999 | Tsai |
| 5,866,213 | A | 2/1999 | Foster et al. |
| 5,866,795 | A | 2/1999 | Wang et al. |
| 5,879,459 | A | 3/1999 | Gadgil et al. |
| 5,882,165 | A | 3/1999 | Maydan et al. |
| 5,882,411 | A | 3/1999 | Zhao et al. |
| 5,882,413 | A | 3/1999 | Beaulieu et al. |
| 5,888,303 | A | 3/1999 | Dixon |
| 5,904,565 | A | 5/1999 | Nguyen et al. |
| 5,906,683 | A | 5/1999 | Chen et al. |
| 5,916,365 | A | 6/1999 | Sherman |
| 5,919,332 | A | 7/1999 | Koshiishi et al. |
| 5,923,056 | A | 7/1999 | Lee et al. |
| 5,923,985 | A | 7/1999 | Aoki et al. |
| 5,925,574 | A | 7/1999 | Aoki et al. |
| 5,928,389 | A | 7/1999 | Jevtic |

(56) References Cited

U.S. PATENT DOCUMENTS

| | | | |
|---|---|---|---|
| 5,942,040 A | 8/1999 | Kim et al. |
| 5,947,710 A | 9/1999 | Cooper et al. |
| 5,951,771 A | 9/1999 | Raney et al. |
| 5,972,430 A | 10/1999 | DiMeo, Jr. et al. |
| 5,996,528 A | 12/1999 | Berrian et al. |
| 6,001,267 A | 12/1999 | Os et al. |
| 6,001,669 A | 12/1999 | Gaines et al. |
| 6,015,590 A | 1/2000 | Suntola et al. |
| 6,015,917 A | 1/2000 | Bhandari et al. |
| 6,025,627 A | 2/2000 | Forbes et al. |
| 6,036,773 A | 3/2000 | Wang et al. |
| 6,042,652 A | 3/2000 | Hyun et al. |
| 6,043,177 A | 3/2000 | Falconer et al. |
| 6,051,286 A | 4/2000 | Zhao et al. |
| 6,062,798 A | 5/2000 | Muka |
| 6,066,358 A | 5/2000 | Guo et al. |
| 6,071,572 A | 6/2000 | Mosely et al. |
| 6,071,808 A | 6/2000 | Merchant et al. |
| 6,079,356 A | 6/2000 | Umotoy et al. |
| 6,084,302 A | 7/2000 | Sandhu |
| 6,086,677 A | 7/2000 | Umotoy et al. |
| 6,099,904 A | 8/2000 | Mak et al. |
| 6,110,556 A | 8/2000 | Bang et al. |
| 6,113,977 A | 9/2000 | Soininen et al. |
| 6,117,244 A | 9/2000 | Bang et al. |
| 6,124,158 A | 9/2000 | Dautartas et al. |
| 6,130,147 A | 10/2000 | Major et al. |
| 6,139,700 A | 10/2000 | Kang et al. |
| 6,140,237 A | 10/2000 | Chan et al. |
| 6,140,238 A | 10/2000 | Kitch |
| 6,143,077 A * | 11/2000 | Ikeda et al. .................. 118/715 |
| 6,143,082 A | 11/2000 | McInerney et al. |
| 6,143,659 A | 11/2000 | Leem |
| 6,144,060 A | 11/2000 | Park et al. |
| 6,156,382 A | 12/2000 | Rajagopalan et al. |
| 6,158,446 A | 12/2000 | Mohindra et al. |
| 6,162,715 A | 12/2000 | Mak et al. |
| 6,174,377 B1 | 1/2001 | Doering et al. |
| 6,174,809 B1 | 1/2001 | Kang et al. |
| 6,179,920 B1 | 1/2001 | Tarutani et al. |
| 6,183,563 B1 | 2/2001 | Choi et al. |
| 6,197,683 B1 | 3/2001 | Kang et al. |
| 6,200,893 B1 | 3/2001 | Sneh |
| 6,203,613 B1 | 3/2001 | Gates et al. |
| 6,206,967 B1 | 3/2001 | Mak et al. |
| 6,207,302 B1 | 3/2001 | Sugiura et al. |
| 6,207,487 B1 | 3/2001 | Kim et al. |
| 6,218,298 B1 | 4/2001 | Hoinkis |
| 6,218,302 B1 | 4/2001 | Braeckelmann et al. |
| 6,231,672 B1 | 5/2001 | Choi et al. |
| 6,248,605 B1 | 6/2001 | Harkonen et al. |
| 6,251,190 B1 | 6/2001 | Mak et al. |
| 6,270,572 B1 | 8/2001 | Kim et al. |
| 6,271,148 B1 | 8/2001 | Kao et al. |
| 6,284,646 B1 | 9/2001 | Leem |
| 6,287,965 B1 | 9/2001 | Kang et al. |
| 6,291,876 B1 | 9/2001 | Stumborg et al. |
| 6,302,965 B1 | 10/2001 | Umotoy et al. |
| 6,305,314 B1 | 10/2001 | Sneh et al. |
| 6,306,216 B1 | 10/2001 | Kim et al. |
| 6,309,713 B1 | 10/2001 | Mak et al. |
| 6,316,098 B1 | 11/2001 | Yitzchaik et al. |
| 6,333,260 B1 | 12/2001 | Kwon et al. |
| 6,334,983 B1 | 1/2002 | Okayama et al. |
| 6,335,280 B1 | 1/2002 | van der Jeugd |
| 6,342,277 B1 | 1/2002 | Sherman |
| 6,348,376 B2 | 2/2002 | Lim et al. |
| 6,355,561 B1 | 3/2002 | Sandhu et al. |
| 6,358,829 B2 | 3/2002 | Yoon et al. |
| 6,368,954 B1 | 4/2002 | Lopatin et al. |
| 6,369,430 B1 | 4/2002 | Adetutu et al. |
| 6,372,598 B2 | 4/2002 | Kang et al. |
| 6,379,748 B1 | 4/2002 | Bhandari et al. |
| 6,391,785 B1 | 5/2002 | Satta et al. |
| 6,399,491 B2 | 6/2002 | Jeon et al. |
| 6,416,577 B1 | 7/2002 | Suntoloa et al. |
| 6,416,822 B1 | 7/2002 | Chiang et al. |
| 6,420,189 B1 | 7/2002 | Lopatin |
| 6,423,619 B1 | 7/2002 | Grant et al. |
| 6,428,859 B1 | 8/2002 | Chiang et al. |
| 6,433,314 B1 | 8/2002 | Mandrekar et al. |
| 6,436,193 B1 | 8/2002 | Kasai et al. |
| 6,447,607 B2 | 9/2002 | Soininen et al. |
| 6,447,933 B1 | 9/2002 | Wang et al. |
| 6,451,119 B2 | 9/2002 | Sneh et al. |
| 6,451,695 B2 | 9/2002 | Sneh |
| 6,454,860 B2 | 9/2002 | Metzner et al. |
| 6,468,924 B2 | 10/2002 | Lee et al. |
| 6,475,276 B1 | 11/2002 | Elers et al. |
| 6,475,910 B1 | 11/2002 | Sneh |
| 6,478,872 B1 | 11/2002 | Chae et al. |
| 6,481,945 B1 | 11/2002 | Hasper et al. |
| 6,482,262 B1 | 11/2002 | Elers et al. |
| 6,482,733 B2 | 11/2002 | Raaijmakers et al. |
| 6,482,740 B2 | 11/2002 | Soininen et al. |
| 6,498,091 B1 | 12/2002 | Chen et al. |
| 6,511,539 B1 | 1/2003 | Raaijmakers |
| 6,520,218 B1 | 2/2003 | Gregg et al. |
| 6,524,952 B1 | 2/2003 | Srinivas et al. |
| 6,534,133 B1 | 3/2003 | Kaloyeros et al. |
| 6,534,395 B2 | 3/2003 | Werkhoven et al. |
| 6,548,112 B1 | 4/2003 | Hillman et al. |
| 6,551,406 B2 | 4/2003 | Kilpi et al. |
| 6,551,929 B1 | 4/2003 | Kori et al. |
| 6,558,509 B2 | 5/2003 | Kraus et al. |
| 6,561,498 B2 | 5/2003 | Tompkins et al. |
| 6,562,140 B1 | 5/2003 | Bondestam et al. |
| 6,569,501 B2 | 5/2003 | Chiang et al. |
| 6,572,705 B1 | 6/2003 | Suntola et al. |
| 6,575,705 B2 | 6/2003 | Akiyama et al. |
| 6,578,287 B2 | 6/2003 | Aswad |
| 6,579,372 B2 | 6/2003 | Park |
| 6,585,823 B1 | 7/2003 | Van Wijck |
| 6,593,484 B2 | 7/2003 | Yasuhara et al. |
| 6,596,602 B2 | 7/2003 | Iizuka et al. |
| 6,599,572 B2 | 7/2003 | Saanila et al. |
| 6,607,976 B2 | 8/2003 | Chen et al. |
| 6,620,723 B1 | 9/2003 | Byun et al. |
| 6,630,030 B1 | 10/2003 | Suntola et al. |
| 6,630,201 B2 | 10/2003 | Chiang et al. |
| 6,632,279 B1 | 10/2003 | Ritala et al. |
| 6,660,126 B2 | 12/2003 | Nguyen et al. |
| 6,660,622 B2 | 12/2003 | Chen et al. |
| 6,686,271 B2 | 2/2004 | Raaijmakers et al. |
| 6,716,287 B1 | 4/2004 | Santiago et al. |
| 6,718,126 B2 | 4/2004 | Lei |
| 6,720,027 B2 | 4/2004 | Yang et al. |
| 6,734,020 B2 | 5/2004 | Lu et al. |
| 6,740,585 B2 | 5/2004 | Yoon et al. |
| 6,772,072 B2 | 8/2004 | Ganguli et al. |
| 6,773,507 B2 | 8/2004 | Jallepally et al. |
| 6,777,352 B2 | 8/2004 | Tepman et al. |
| 6,778,762 B1 | 8/2004 | Shareef et al. |
| 6,784,096 B2 | 8/2004 | Chen et al. |
| 6,790,773 B1 | 9/2004 | Drewery et al. |
| 6,797,108 B2 | 9/2004 | Wendling |
| 6,800,173 B2 | 10/2004 | Chiang et al. |
| 6,803,272 B1 | 10/2004 | Halliyal et al. |
| 6,815,285 B2 | 11/2004 | Choi et al. |
| 6,818,094 B2 | 11/2004 | Yudovsky |
| 6,821,563 B2 | 11/2004 | Yudovsky |
| 6,827,815 B2 | 12/2004 | Hytros et al. |
| 6,831,004 B2 | 12/2004 | Byun et al. |
| 6,838,125 B2 | 1/2005 | Chung et al. |
| 6,841,200 B2 | 1/2005 | Kraus et al. |
| 6,846,516 B2 | 1/2005 | Yang et al. |
| 6,866,746 B2 | 3/2005 | Lei et al. |
| 6,868,859 B2 | 3/2005 | Yudovsky |
| 6,875,271 B2 | 4/2005 | Glenn et al. |
| 6,878,206 B2 | 4/2005 | Tzu et al. |
| 6,881,437 B2 | 4/2005 | Ivanov et al. |
| 6,893,915 B2 | 5/2005 | Park et al. |
| 6,902,624 B2 | 6/2005 | Seidel et al. |
| 6,905,541 B2 | 6/2005 | Chen et al. |

(56) References Cited

U.S. PATENT DOCUMENTS

| | | | |
|---|---|---|---|
| 6,905,737 B2 | 6/2005 | Verplancken et al. | |
| 6,911,093 B2 | 6/2005 | Stacey et al. | |
| 6,915,592 B2 | 7/2005 | Guenther | |
| 6,916,398 B2* | 7/2005 | Chen et al. | 118/715 |
| 6,921,062 B2 | 7/2005 | Gregg et al. | |
| 6,932,871 B2 | 8/2005 | Chang et al. | |
| 6,936,906 B2 | 8/2005 | Chung et al. | |
| 6,939,801 B2 | 9/2005 | Chung et al. | |
| 6,946,033 B2 | 9/2005 | Tsuei et al. | |
| 6,951,804 B2 | 10/2005 | Seutter et al. | |
| 6,953,742 B2 | 10/2005 | Chen et al. | |
| 6,955,211 B2 | 10/2005 | Ku et al. | |
| 6,972,267 B2 | 12/2005 | Cao et al. | |
| 6,974,771 B2 | 12/2005 | Chen et al. | |
| 6,983,892 B2 | 1/2006 | Noorbakhsh et al. | |
| 6,994,319 B2 | 2/2006 | Yudovsky | |
| 6,998,014 B2 | 2/2006 | Chen et al. | |
| 7,026,238 B2 | 4/2006 | Xi et al. | |
| 7,041,335 B2 | 5/2006 | Chung | |
| 7,049,226 B2 | 5/2006 | Chung et al. | |
| 7,066,194 B2 | 6/2006 | Ku et al. | |
| 7,067,422 B2 | 6/2006 | Nakamura et al. | |
| 7,081,271 B2 | 7/2006 | Chung et al. | |
| 7,081,409 B2 | 7/2006 | Kang et al. | |
| 7,085,616 B2 | 8/2006 | Chin et al. | |
| 7,094,680 B2 | 8/2006 | Seutter et al. | |
| 7,098,131 B2 | 8/2006 | Kang et al. | |
| 7,175,713 B2 | 2/2007 | Thakur et al. | |
| 7,186,385 B2 | 3/2007 | Ganguli et al. | |
| 7,201,803 B2 | 4/2007 | Lu et al. | |
| 7,204,886 B2 | 4/2007 | Chen et al. | |
| 7,208,413 B2 | 4/2007 | Byun et al. | |
| 7,211,508 B2 | 5/2007 | Chung et al. | |
| 7,222,636 B2 | 5/2007 | Nguyen et al. | |
| 7,228,873 B2 | 6/2007 | Ku et al. | |
| 7,780,785 B2* | 8/2010 | Chen et al. | 118/715 |
| 7,780,788 B2* | 8/2010 | Chen et al. | 118/715 |
| 2001/0000866 A1 | 5/2001 | Sneh et al. | |
| 2001/0002280 A1 | 5/2001 | Sneh | |
| 2001/0009140 A1 | 7/2001 | Bondestam et al. | |
| 2001/0009695 A1 | 7/2001 | Saanila et al. | |
| 2001/0011526 A1 | 8/2001 | Doering et al. | |
| 2001/0013312 A1 | 8/2001 | Soininen et al. | |
| 2001/0014371 A1 | 8/2001 | Kilpi | |
| 2001/0024387 A1 | 9/2001 | Raaijmakers et al. | |
| 2001/0025979 A1 | 10/2001 | Kim et al. | |
| 2001/0028924 A1 | 10/2001 | Sherman | |
| 2001/0029094 A1 | 10/2001 | Mee-Young et al. | |
| 2001/0031562 A1 | 10/2001 | Raaijmakers et al. | |
| 2001/0034123 A1 | 10/2001 | Jeon et al. | |
| 2001/0041250 A1 | 11/2001 | Werkhoven et al. | |
| 2001/0042523 A1 | 11/2001 | Kesala | |
| 2001/0042799 A1 | 11/2001 | Kim et al. | |
| 2001/0054377 A1 | 12/2001 | Lindfors et al. | |
| 2001/0054730 A1 | 12/2001 | Kim et al. | |
| 2001/0054769 A1 | 12/2001 | Raaijmakers et al. | |
| 2002/0000196 A1 | 1/2002 | Park | |
| 2002/0000598 A1 | 1/2002 | Kang et al. | |
| 2002/0004293 A1 | 1/2002 | Soininen et al. | |
| 2002/0005168 A1 | 1/2002 | Kraus et al. | |
| 2002/0007790 A1 | 1/2002 | Park | |
| 2002/0009544 A1 | 1/2002 | McFeely et al. | |
| 2002/0009896 A1 | 1/2002 | Sandhu et al. | |
| 2002/0017242 A1 | 2/2002 | Hamaguchi et al. | |
| 2002/0019121 A1 | 2/2002 | Pyo | |
| 2002/0020869 A1 | 2/2002 | Park et al. | |
| 2002/0021544 A1 | 2/2002 | Cho et al. | |
| 2002/0031618 A1 | 3/2002 | Sherman | |
| 2002/0037630 A1 | 3/2002 | Agarwal et al. | |
| 2002/0041931 A1 | 4/2002 | Suntola et al. | |
| 2002/0048635 A1 | 4/2002 | Kim et al. | |
| 2002/0048880 A1 | 4/2002 | Lee | |
| 2002/0052097 A1 | 5/2002 | Park | |
| 2002/0055235 A1 | 5/2002 | Agarwal et al. | |
| 2002/0060363 A1 | 5/2002 | Xi et al. | |
| 2002/0061612 A1 | 5/2002 | Sandhu et al. | |
| 2002/0066411 A1 | 6/2002 | Chiang et al. | |
| 2002/0068458 A1 | 6/2002 | Chiang et al. | |
| 2002/0073924 A1 | 6/2002 | Chiang et al. | |
| 2002/0076481 A1 | 6/2002 | Chiang et al. | |
| 2002/0076507 A1 | 6/2002 | Chiang et al. | |
| 2002/0076508 A1 | 6/2002 | Chiang et al. | |
| 2002/0076837 A1 | 6/2002 | Hujanen et al. | |
| 2002/0086106 A1 | 7/2002 | Park et al. | |
| 2002/0086111 A1 | 7/2002 | Byun et al. | |
| 2002/0086507 A1 | 7/2002 | Park et al. | |
| 2002/0090829 A1 | 7/2002 | Sandhu et al. | |
| 2002/0092471 A1 | 7/2002 | Kang et al. | |
| 2002/0094689 A1 | 7/2002 | Park | |
| 2002/0098627 A1 | 7/2002 | Pomarede et al. | |
| 2002/0104481 A1 | 8/2002 | Chiang et al. | |
| 2002/0105088 A1 | 8/2002 | Yang et al. | |
| 2002/0106536 A1 | 8/2002 | Lee et al. | |
| 2002/0106846 A1 | 8/2002 | Seutter et al. | |
| 2002/0108570 A1 | 8/2002 | Lindfors | |
| 2002/0109168 A1 | 8/2002 | Kim et al. | |
| 2002/0110991 A1 | 8/2002 | Li | |
| 2002/0115886 A1 | 8/2002 | Yasuhara et al. | |
| 2002/0117399 A1 | 8/2002 | Chen et al. | |
| 2002/0121241 A1 | 9/2002 | Nguyen et al. | |
| 2002/0121342 A1 | 9/2002 | Nguyen et al. | |
| 2002/0127336 A1 | 9/2002 | Chen et al. | |
| 2002/0127745 A1 | 9/2002 | Lu et al. | |
| 2002/0134307 A1 | 9/2002 | Choi | |
| 2002/0144655 A1 | 10/2002 | Chiang et al. | |
| 2002/0144657 A1 | 10/2002 | Chiang et al. | |
| 2002/0145210 A1 | 10/2002 | Tompkins et al. | |
| 2002/0146511 A1* | 10/2002 | Chiang et al. | 427/248.1 |
| 2002/0155722 A1 | 10/2002 | Satta et al. | |
| 2002/0162506 A1 | 11/2002 | Sneh et al. | |
| 2002/0164421 A1 | 11/2002 | Chiang et al. | |
| 2002/0164423 A1 | 11/2002 | Chiang et al. | |
| 2002/0177282 A1 | 11/2002 | Song | |
| 2002/0182320 A1 | 12/2002 | Leskela et al. | |
| 2002/0187256 A1 | 12/2002 | Elers et al. | |
| 2002/0197402 A1 | 12/2002 | Chiang et al. | |
| 2003/0004723 A1 | 1/2003 | Chihara | |
| 2003/0010451 A1 | 1/2003 | Tzu et al. | |
| 2003/0013320 A1 | 1/2003 | Kim et al. | |
| 2003/0017697 A1 | 1/2003 | Choi et al. | |
| 2003/0019428 A1 | 1/2003 | Ku et al. | |
| 2003/0022487 A1 | 1/2003 | Yoon et al. | |
| 2003/0023338 A1 | 1/2003 | Chin et al. | |
| 2003/0029715 A1 | 2/2003 | Yu et al. | |
| 2003/0031807 A1 | 2/2003 | Elers et al. | |
| 2003/0038369 A1 | 2/2003 | Layadi et al. | |
| 2003/0042630 A1 | 3/2003 | Babcoke et al. | |
| 2003/0049931 A1 | 3/2003 | Byun et al. | |
| 2003/0049942 A1 | 3/2003 | Haukka et al. | |
| 2003/0053799 A1 | 3/2003 | Lei | |
| 2003/0057526 A1 | 3/2003 | Chung et al. | |
| 2003/0057527 A1 | 3/2003 | Chung et al. | |
| 2003/0059538 A1 | 3/2003 | Chung et al. | |
| 2003/0072913 A1 | 4/2003 | Chou et al. | |
| 2003/0072975 A1 | 4/2003 | Shero et al. | |
| 2003/0075273 A1 | 4/2003 | Kilpela et al. | |
| 2003/0075925 A1 | 4/2003 | Lindfors et al. | |
| 2003/0079686 A1 | 5/2003 | Chen et al. | |
| 2003/0082296 A1 | 5/2003 | Elers et al. | |
| 2003/0082301 A1 | 5/2003 | Chen et al. | |
| 2003/0082307 A1 | 5/2003 | Chung et al. | |
| 2003/0087520 A1 | 5/2003 | Chen et al. | |
| 2003/0089308 A1 | 5/2003 | Raaijmakers | |
| 2003/0101927 A1 | 6/2003 | Raaijmakers | |
| 2003/0101938 A1 | 6/2003 | Ronsse et al. | |
| 2003/0104126 A1 | 6/2003 | Fang et al. | |
| 2003/0106490 A1 | 6/2003 | Jallepally et al. | |
| 2003/0108674 A1 | 6/2003 | Chung et al. | |
| 2003/0113187 A1 | 6/2003 | Lei et al. | |
| 2003/0116087 A1 | 6/2003 | Nguyen et al. | |
| 2003/0121469 A1 | 7/2003 | Lindfors et al. | |
| 2003/0121608 A1 | 7/2003 | Chen et al. | |
| 2003/0124262 A1 | 7/2003 | Chen et al. | |
| 2003/0129826 A1 | 7/2003 | Werkhoven et al. | |

(56) References Cited

U.S. PATENT DOCUMENTS

| | | |
|---|---|---|
| 2003/0134508 A1 | 7/2003 | Raaijmakers et al. |
| 2003/0140854 A1 | 7/2003 | Kilpi |
| 2003/0143328 A1 | 7/2003 | Chen et al. |
| 2003/0143747 A1 | 7/2003 | Bondestam et al. |
| 2003/0143839 A1 | 7/2003 | Raaijmakers et al. |
| 2003/0153177 A1 | 8/2003 | Tepman et al. |
| 2003/0167612 A1 | 9/2003 | Kraus et al. |
| 2003/0168750 A1 | 9/2003 | Basceri et al. |
| 2003/0172872 A1 | 9/2003 | Thakur et al. |
| 2003/0173586 A1 | 9/2003 | Moriwaki et al. |
| 2003/0186495 A1 | 10/2003 | Saanila et al. |
| 2003/0190423 A1 | 10/2003 | Yang et al. |
| 2003/0190804 A1 | 10/2003 | Glenn et al. |
| 2003/0194493 A1 | 10/2003 | Chang et al. |
| 2003/0198740 A1 | 10/2003 | Wendling |
| 2003/0198754 A1 | 10/2003 | Xi et al. |
| 2003/0205729 A1 | 11/2003 | Basceri et al. |
| 2003/0213560 A1 | 11/2003 | Wang et al. |
| 2003/0213987 A1 | 11/2003 | Basceri et al. |
| 2003/0216981 A1 | 11/2003 | Tillman |
| 2003/0219942 A1 | 11/2003 | Choi et al. |
| 2003/0221780 A1 | 12/2003 | Lei et al. |
| 2003/0224107 A1 | 12/2003 | Lindfors et al. |
| 2003/0224578 A1 | 12/2003 | Chung et al. |
| 2003/0224600 A1 | 12/2003 | Cao et al. |
| 2003/0232497 A1 | 12/2003 | Xi et al. |
| 2003/0235961 A1 | 12/2003 | Metzner et al. |
| 2004/0005749 A1 | 1/2004 | Choi et al. |
| 2004/0009307 A1 | 1/2004 | Koh et al. |
| 2004/0011404 A1 | 1/2004 | Ku et al. |
| 2004/0011504 A1 | 1/2004 | Ku et al. |
| 2004/0013577 A1 | 1/2004 | Ganguli et al. |
| 2004/0014320 A1 | 1/2004 | Chen et al. |
| 2004/0015300 A1 | 1/2004 | Ganguli et al. |
| 2004/0016404 A1 | 1/2004 | Gregg et al. |
| 2004/0018304 A1 | 1/2004 | Chung et al. |
| 2004/0018723 A1 | 1/2004 | Byun et al. |
| 2004/0018747 A1 | 1/2004 | Lee et al. |
| 2004/0025370 A1 | 2/2004 | Guenther |
| 2004/0033698 A1 | 2/2004 | Lee et al. |
| 2004/0046197 A1 | 3/2004 | Basceri et al. |
| 2004/0048461 A1 | 3/2004 | Chen et al. |
| 2004/0065255 A1 | 4/2004 | Yang et al. |
| 2004/0067641 A1 | 4/2004 | Yudovsky |
| 2004/0069227 A1 | 4/2004 | Ku et al. |
| 2004/0071897 A1 | 4/2004 | Verplancken et al. |
| 2004/0077183 A1 | 4/2004 | Chung |
| 2004/0105934 A1 | 6/2004 | Chang et al. |
| 2004/0143370 A1 | 7/2004 | Lu et al. |
| 2004/0144308 A1 | 7/2004 | Yudovsky |
| 2004/0144309 A1 | 7/2004 | Yudovsky |
| 2004/0144311 A1 | 7/2004 | Chen et al. |
| 2004/0144431 A1 | 7/2004 | Yudovsky |
| 2004/0170403 A1 | 9/2004 | Lei |
| 2004/0187304 A1 | 9/2004 | Chen et al. |
| 2004/0203254 A1 | 10/2004 | Conley et al. |
| 2004/0209460 A1 | 10/2004 | Xi et al. |
| 2004/0211665 A1 | 10/2004 | Yoon et al. |
| 2004/0219784 A1 | 11/2004 | Kang et al. |
| 2004/0224506 A1 | 11/2004 | Choi et al. |
| 2004/0235285 A1 | 11/2004 | Kang et al. |
| 2004/0241321 A1 | 12/2004 | Ganguli et al. |
| 2004/0253375 A1 | 12/2004 | Ivanov et al. |
| 2004/0256351 A1 | 12/2004 | Chung et al. |
| 2004/0266175 A1 | 12/2004 | Chen et al. |
| 2005/0006799 A1 | 1/2005 | Gregg et al. |
| 2005/0008779 A1 | 1/2005 | Yang et al. |
| 2005/0009325 A1 | 1/2005 | Chung et al. |
| 2005/0059240 A1 | 3/2005 | Choi et al. |
| 2005/0064207 A1 | 3/2005 | Senzaki et al. |
| 2005/0070126 A1 | 3/2005 | Senzaki |
| 2005/0074968 A1 | 4/2005 | Chen et al. |
| 2005/0095859 A1 | 5/2005 | Chen et al. |
| 2005/0104142 A1 | 5/2005 | Narayanan et al. |
| 2005/0106865 A1 | 5/2005 | Chung et al. |
| 2005/0115675 A1 | 6/2005 | Tzu et al. |
| 2005/0118804 A1 | 6/2005 | Byun et al. |
| 2005/0139160 A1 | 6/2005 | Lei et al. |
| 2005/0139948 A1 | 6/2005 | Chung et al. |
| 2005/0153571 A1 | 7/2005 | Senzaki |
| 2005/0164487 A1 | 7/2005 | Seutter et al. |
| 2005/0173068 A1 | 8/2005 | Chen et al. |
| 2005/0189072 A1 | 9/2005 | Chen et al. |
| 2005/0220998 A1 | 10/2005 | Chang et al. |
| 2005/0229969 A1 | 10/2005 | Nguyen et al. |
| 2005/0233156 A1 | 10/2005 | Senzaki et al. |
| 2005/0252449 A1 | 11/2005 | Nguyen et al. |
| 2005/0255243 A1 | 11/2005 | Senzaki |
| 2005/0255690 A1 | 11/2005 | Chen et al. |
| 2005/0257735 A1 | 11/2005 | Guenther |
| 2005/0260357 A1 | 11/2005 | Olsen et al. |
| 2005/0266682 A1 | 12/2005 | Chen et al. |
| 2005/0271812 A1 | 12/2005 | Myo et al. |
| 2005/0271813 A1 | 12/2005 | Kher et al. |
| 2005/0271814 A1 | 12/2005 | Chang et al. |
| 2006/0018639 A1 | 1/2006 | Ramamurthy et al. |
| 2006/0019033 A1 | 1/2006 | Muthukrishnan et al. |
| 2006/0019494 A1 | 1/2006 | Cao et al. |
| 2006/0019495 A1 | 1/2006 | Marcadal et al. |
| 2006/0030148 A1 | 2/2006 | Seutter et al. |
| 2006/0035025 A1 | 2/2006 | Verplancken et al. |
| 2006/0057843 A1 | 3/2006 | Chen et al. |
| 2006/0062917 A1 | 3/2006 | Muthukrishnan et al. |
| 2006/0075966 A1 | 4/2006 | Chen et al. |
| 2006/0128150 A1 | 6/2006 | Gandikota et al. |
| 2006/0148253 A1 | 7/2006 | Chung et al. |
| 2006/0153973 A1 | 7/2006 | Chang et al. |
| 2006/0153995 A1 | 7/2006 | Narwankar et al. |
| 2006/0156979 A1 | 7/2006 | Thakur et al. |
| 2006/0199372 A1 | 9/2006 | Chung et al. |
| 2006/0213557 A1 | 9/2006 | Ku et al. |
| 2006/0213558 A1 | 9/2006 | Ku et al. |
| 2006/0216928 A1 | 9/2006 | Chung et al. |
| 2006/0223286 A1 | 10/2006 | Chin et al. |
| 2006/0257295 A1 | 11/2006 | Chen et al. |
| 2006/0276020 A1 | 12/2006 | Yoon et al. |
| 2007/0003698 A1 | 1/2007 | Chen et al. |
| 2007/0018244 A1 | 1/2007 | Hung et al. |
| 2007/0020890 A1 | 1/2007 | Thakur et al. |
| 2007/0026147 A1 | 2/2007 | Chen et al. |
| 2007/0067609 A1 | 3/2007 | Chen et al. |
| 2007/0079759 A1 | 4/2007 | Lee et al. |
| 2007/0095285 A1 | 5/2007 | Thakur et al. |
| 2007/0099415 A1 | 5/2007 | Chen et al. |
| 2007/0119370 A1 | 5/2007 | Ma et al. |
| 2007/0119371 A1 | 5/2007 | Ma et al. |
| 2007/0128862 A1 | 6/2007 | Ma et al. |
| 2007/0128863 A1 | 6/2007 | Ma et al. |
| 2007/0128864 A1 | 6/2007 | Ma et al. |

FOREIGN PATENT DOCUMENTS

| | | |
|---|---|---|
| DE | 19820147 A1 | 7/1999 |
| EP | 0344352 A1 | 12/1989 |
| EP | 0429270 A2 | 5/1991 |
| EP | 0442490 A1 | 8/1991 |
| EP | 0497267 | 8/1992 |
| EP | 0799641 A2 | 10/1997 |
| EP | 1077484 A2 | 2/2001 |
| EP | 1167569 A1 | 1/2002 |
| EP | 1 187 569 A1 | 3/2002 |
| FR | 2626110 A1 | 7/1989 |
| FR | 2692597 A1 | 12/1993 |
| GB | 2 355 727 | 5/2001 |
| JP | 58098917 A | 6/1983 |
| JP | 58100419 A | 6/1983 |
| JP | 60065712 A | 4/1985 |
| JP | 61035847 A | 2/1986 |
| JP | 61210623 | 9/1986 |
| JP | 62-033768 A | 2/1987 |
| JP | 62069508 A | 3/1987 |
| JP | 62091495 A | 4/1987 |
| JP | 62141717 | 6/1987 |
| JP | 62167297 A | 7/1987 |

(56) References Cited

FOREIGN PATENT DOCUMENTS

| | | |
|---|---|---|
| JP | 62171999 A | 7/1987 |
| JP | 62232919 A | 10/1987 |
| JP | 63062313 | 3/1988 |
| JP | 63085098 | 4/1988 |
| JP | 63090833 | 4/1988 |
| JP | 63222420 A | 9/1988 |
| JP | 63222421 A | 9/1988 |
| JP | 63227007 A | 9/1988 |
| JP | 63252420 A | 10/1988 |
| JP | 63266814 A | 11/1988 |
| JP | 64009895 U | 1/1989 |
| JP | 64009896 U | 1/1989 |
| JP | 64009897 U | 1/1989 |
| JP | 64037832 | 2/1989 |
| JP | 64082615 | 3/1989 |
| JP | 64082617 | 3/1989 |
| JP | 64082671 | 3/1989 |
| JP | 64082676 | 3/1989 |
| JP | 01103982 A | 4/1989 |
| JP | 01103996 A | 4/1989 |
| JP | 64090524 | 4/1989 |
| JP | 01117017 A | 5/1989 |
| JP | 1143221 A | 6/1989 |
| JP | 01143233 A | 6/1989 |
| JP | 01154511 A | 6/1989 |
| JP | 1236657 A | 9/1989 |
| JP | 1245512 A | 9/1989 |
| JP | 1264218 A | 10/1989 |
| JP | 1270593 A | 10/1989 |
| JP | 1272108 A | 10/1989 |
| JP | 1290221 | 11/1989 |
| JP | 1290222 A | 11/1989 |
| JP | 1296673 A | 11/1989 |
| JP | 1303770 A | 12/1989 |
| JP | 1305894 A | 12/1989 |
| JP | 1313927 A | 12/1989 |
| JP | 2012814 A | 1/1990 |
| JP | 2014513 A | 1/1990 |
| JP | 2017634 A | 1/1990 |
| JP | 2063115 A | 3/1990 |
| JP | 2074029 A | 3/1990 |
| JP | 2074587 A | 3/1990 |
| JP | 2106822 A | 4/1990 |
| JP | 2129913 A | 5/1990 |
| JP | 2162717 A | 6/1990 |
| JP | 2172895 A | 7/1990 |
| JP | 2196092 A | 8/1990 |
| JP | 2203517 A | 8/1990 |
| JP | 2230690 A | 9/1990 |
| JP | 2230722 A | 9/1990 |
| JP | 02-246161 A | 10/1990 |
| JP | 2264491 A | 10/1990 |
| JP | 2283084 A | 11/1990 |
| JP | 02304916 A | 12/1990 |
| JP | 3019211 A | 1/1991 |
| JP | 3022569 A | 1/1991 |
| JP | 3023294 A | 1/1991 |
| JP | 3023299 A | 1/1991 |
| JP | 3044967 A | 2/1991 |
| JP | 3048421 A | 3/1991 |
| JP | 3070124 A | 3/1991 |
| JP | 3185716 A | 8/1991 |
| JP | 3208885 A | 9/1991 |
| JP | 3234025 A | 10/1991 |
| JP | 3286522 A | 12/1991 |
| JP | 3286531 A | 12/1991 |
| JP | 04-064223 A | 2/1992 |
| JP | 4031391 A | 2/1992 |
| JP | 4031396 A | 2/1992 |
| JP | 04087323 A | 3/1992 |
| JP | 4100292 A | 4/1992 |
| JP | 4111418 A | 4/1992 |
| JP | 4132214 A | 5/1992 |
| JP | 4132681 A | 5/1992 |
| JP | 4151822 A | 5/1992 |
| JP | 4162418 A | 6/1992 |
| JP | 4175299 A | 6/1992 |
| JP | 4186824 A | 7/1992 |
| JP | 4212411 A | 8/1992 |
| JP | 4260696 A | 9/1992 |
| JP | 4273120 A | 9/1992 |
| JP | 4285167 A | 10/1992 |
| JP | 4291916 A | 10/1992 |
| JP | 4325500 A | 11/1992 |
| JP | 4328874 A | 11/1992 |
| JP | 5029228 A | 2/1993 |
| JP | 5047665 A | 2/1993 |
| JP | 5047668 A | 2/1993 |
| JP | 5074717 A | 3/1993 |
| JP | 5074724 A | 3/1993 |
| JP | 5102189 A | 4/1993 |
| JP | 5047666 U | 6/1993 |
| JP | 5160152 A | 6/1993 |
| JP | 5175143 A | 7/1993 |
| JP | 5175145 A | 7/1993 |
| JP | 5182906 A | 7/1993 |
| JP | 5186295 A | 7/1993 |
| JP | 5206036 A | 8/1993 |
| JP | 5234899 A | 9/1993 |
| JP | 5235047 A | 9/1993 |
| JP | 5251339 A | 9/1993 |
| JP | 5270997 A | 10/1993 |
| JP | 5283336 A | 10/1993 |
| JP | 5291152 A | 11/1993 |
| JP | 5304334 A | 11/1993 |
| JP | 5343327 A | 12/1993 |
| JP | 5343685 A | 12/1993 |
| JP | 6045606 A | 2/1994 |
| JP | 06-132236 A | 5/1994 |
| JP | 6177381 A | 6/1994 |
| JP | 06-196809 | 7/1994 |
| JP | 06-198809 A | 7/1994 |
| JP | 6222388 A | 8/1994 |
| JP | 6224138 A | 8/1994 |
| JP | 6230421 A | 8/1994 |
| JP | 06252057 | 9/1994 |
| JP | 06291048 | 10/1994 |
| JP | 7070752 A | 3/1995 |
| JP | 7086269 A | 3/1995 |
| JP | 07-300649 A | 11/1995 |
| JP | 8181076 A | 7/1996 |
| JP | 8245291 A | 9/1996 |
| JP | 08264530 | 10/1996 |
| JP | 09260786 | 10/1997 |
| JP | 09293681 | 11/1997 |
| JP | 10188840 | 7/1998 |
| JP | 10190128 | 7/1998 |
| JP | 10-308283 | 11/1998 |
| JP | 10-335264 A | 12/1998 |
| JP | 11117071 A * | 4/1999 |
| JP | 11269652 | 10/1999 |
| JP | 2000-031387 | 1/2000 |
| JP | 2000-058777 | 2/2000 |
| JP | 2000068072 | 3/2000 |
| JP | 2000087029 | 3/2000 |
| JP | 2000138094 | 5/2000 |
| JP | 2000212752 | 8/2000 |
| JP | 2000218445 | 8/2000 |
| JP | 2000-319773 A | 11/2000 |
| JP | 2000319772 A | 11/2000 |
| JP | 2000340883 | 12/2000 |
| JP | 2000353666 | 12/2000 |
| JP | 2001020075 | 1/2001 |
| JP | 2001020075 A | 1/2001 |
| JP | 2001062244 | 3/2001 |
| JP | 2001-111000 | 4/2001 |
| JP | 2001-172767 | 6/2001 |
| JP | 2001152339 | 6/2001 |
| JP | 2001189312 | 7/2001 |
| JP | 2001-220294 | 8/2001 |
| JP | 2001217206 A | 8/2001 |
| JP | 2001220287 | 8/2001 |
| JP | 2001-254181 | 9/2001 |
| JP | 2001240972 | 9/2001 |

(56) References Cited

FOREIGN PATENT DOCUMENTS

| | | |
|---|---|---|
| JP | 2001284042 | 10/2001 |
| JP | 2001303251 | 10/2001 |
| JP | 2001328900 | 11/2001 |
| KR | 2003040650 | 5/2003 |
| WO | WO-9002216 A1 | 3/1990 |
| WO | WO-9110510 | 7/1991 |
| WO | WO-9302111 A1 | 2/1993 |
| WO | WO-9617107 A1 | 6/1996 |
| WO | WO-9618756 A1 | 6/1996 |
| WO | WO-97/03223 A1 | 1/1997 |
| WO | WO-9806889 A2 | 2/1998 |
| WO | WO-9851838 A1 | 11/1998 |
| WO | WO-9901595 A1 | 1/1999 |
| WO | WO-9913504 A1 | 3/1999 |
| WO | WO-9929924 A1 | 6/1999 |
| WO | WO-9941423 A2 | 8/1999 |
| WO | WO-9965064 A1 | 12/1999 |
| WO | WO-0011721 A1 | 3/2000 |
| WO | WO-0015865 A1 | 3/2000 |
| WO | WO-0015881 A2 | 3/2000 |
| WO | WO-0016377 A2 | 3/2000 |
| WO | WO-0054320 A1 | 9/2000 |
| WO | WO-0063957 A1 | 10/2000 |
| WO | WO-0079019 A1 | 12/2000 |
| WO | WO-0079576 A1 | 12/2000 |
| WO | WO-01/12891 A1 | 2/2001 |
| WO | WO-01/17691 A1 | 3/2001 |
| WO | WO-0115220 A1 | 3/2001 |
| WO | WO-0117692 A1 | 3/2001 |
| WO | WO-01/28983 A1 | 4/2001 |
| WO | WO-0127346 A1 | 4/2001 |
| WO | WO-0127347 A1 | 4/2001 |
| WO | WO-0129280 A1 | 4/2001 |
| WO | WO-0129891 A1 | 4/2001 |
| WO | WO-0129893 A1 | 4/2001 |
| WO | WO-0136702 A1 | 5/2001 |
| WO | WO-0140541 A1 | 6/2001 |
| WO | WO-0166832 A2 | 9/2001 |
| WO | WO-0201628 | 1/2002 |
| WO | WO-0208485 | 1/2002 |
| WO | WO-0208488 A1 | 1/2002 |
| WO | WO-02/27078 A1 | 4/2002 |
| WO | WO-0243115 | 5/2002 |
| WO | WO-0245167 | 6/2002 |
| WO | WO-0245871 A1 | 6/2002 |
| WO | WO-0246489 | 6/2002 |
| WO | WO-02/063677 A1 | 8/2002 |
| WO | WO-02067319 | 8/2002 |
| WO | WO-03023835 | 3/2003 |
| WO | WO-03/035927 A2 | 5/2003 |
| WO | WO-03/037549 A1 | 5/2003 |
| WO | WO-2004/008491 A2 | 1/2004 |
| WO | WO-2004106584 | 12/2004 |

OTHER PUBLICATIONS

Bader, et al. "Integrated Processing Equipment", Solid State Technology, Cowan Pub., vol. 33, No. 5 (May 1, 1990), pp. 149-154.
Bedair "Atomic layer epitaxy deposition processes", J. Vac. Sci. Techol. 12(1) (Jan./Feb. 1994).
Choi, et al. "Stability of $TiB_2$ as a Diffusion Barrier on Silicon", J. Etectrochem. Soc. 138(10) (Oct. 1991), pp. 3062-3067.
Choi, et al. "The effect of annealing on resistivity of low pressure chemical vapor depositied titanium diboride", J. Appl. Phys. 69(11) (Jun. 1, 1991), pp. 7853-7861.
Clark-Phelps, et al. "Engineered Tantalum Aluminate and Hafnium Aluminate ALD Films for Ultrathin Dielectric Films with Improved Electrical and Thermal Properties", Mat. Res. Soc. Symp. Proc. vol. 670 (2001).
Derbyshire "Applications of Integrated processing", Solid State Technology, US, Cowan Pub., vol. 37, No. 12 (Dec. 1, 1994), pp. 45-47.
Eisenbraum, et al. "Atomic Layer Deposition (ALD) of Tantalum-based materials for zero thickness copper barrier applications", Proceedings of the IEEE 2001 International Interconnect Technology Conference (Cat. No. 01 EX461) 2001.
Elam, et al. "Nucleation and growth during tungsten atomic layer deposition on $SiO_2$ surfaces", Thin Solids Films 386 (2001) pp. 41-52, (Accepted Dec. 14, 2000).
Elers, et al. "$NbCl_5$ as a precursor in atomic layer epitaxy", Appl. Surf. Sci., vol. 82/83 (1994), pp. 468-474.
George, et al. "Atomic layer controlled deposition of $SiO_2$ and $Al_2O_2$ using Abab . . . binary reaction sequence chemistry", Appl. Surf. Sci., vol. 82/83 (1994), pp. 460-467.
George, et al. "Surface Chemistry for Atomic Layer Growth," J. Phys. Chem. 1996, 100, 13121-13131.
Hiltunen, et al. "Nitrides of titanium, niobium, tantalum and molybdenum grown as thin films by the atomic layer epitaxy method", Thin Solids Films, 166 (1988), pp. 149-154.
Hultman, et al. "Review of the thermal and mechanical stability of TiN-based thin films", Zeitschrfft Fur Metallkunde, 90(10) (Oct. 1999), pp. 803-813.
IBM Tech. Disc. Bull. Knowledge-Based Dynamic Scheduler in Distributed Computer Control, (Jun. 1990), pp. 80-84.
IBM Tech. Disc. Bull. "Multiprocessor and Multitasking Architecture for Tool Control of the Advanced via Inspection Tools" (May 1992), pp. 190-191.
International Search Report from the European Patent Office for International Application No. PCT/US 02/34553, dated May 8, 2003 (WO 03/035927).
International Search Report from the European Patent Office for International Application No. PCT/US 02/34277, dated May 9, 2003 (WO 03/037549).
Kitigawa, et al. "Hydrogen-mediated low temperature epitaxy of Si in plasma-enhanced chemical vapor deposition", Applied Surface Science (2000), pp. 30-34.
Klaus, et al. "Atomic Layer Deposition of SiO2 Using Catalyzed and Uncatalyzed Self-Limiting Surface Reactions", Surface Review and Letters, vol. 6, Nos. 3 & 4 (1999) 435-448.
Klaus, et al. "Atomic Layer Deposition of Tungsten using Sequential Surface Chemistry with a Sacrificial Stripping Reaction", Thin Solid Films 360 (2000), pp. 145-153, (Accepted Nov. 16, 1999).
Klaus, et al. "Atomically Controlled Growth of Tungsten and Tungsten Nitride Using Sequential Surface Reactions", Applied Surface Science, 162-163 (2000) pp. 479-491.
Kukli, et al. "Atomic Layer Epitaxy Growth of Tantalum Oxide Thin Films from $Ta(OC_2H_5)$ and $H_2O$", Journal of the Electrochemical Society, vol. 142, No. 5, May 1995; pp. 1670-1675.
Kukli, et al. "In situ Study of Atomic Layer Epitaxy Growth of Tantalum Oxide Thin Films From $Ta(OC_2H_5)_5$ and $H_2O$", Applied Surface Science, vol. 112, Mar. 1997, pp. 236-242.
Kukli, et al. "Properties of $(Nb_{1-x}Ta_x)_2O_5$ Solid Solutions and $(Nb_{1-x}Ta_x)_2O_5$—$ZrO_2$ Nanolaminates Grown by Atomic Layer Epitaxy",1997; pp. 785-793.
Kukli, et al. "Properties of $Ta_2O_5$-Based Dielectric Nanolaminates Deposited by Atomic Layer Epitaxy", Journal of the Electrochemical Society, vol. 144, No. 1, Jan. 1997; pp. 300-306.
Kukli, et al. "Tailoring the Dielectric Properties of $HfO_2$-$Ta_2O_5$ Nanolaminates", Applied Physics Letters, vol. 68, No. 26 (Jun. 24, 1996), pp. 3737-3739.
Lee, C. "The Preparation of Titanium-Based Thin Film by CVD Using Titanium Chlorides as Precursors", Chemical Vapor Deposition, 5(2) Mar. 1999, pp. 69-73.
Lee, et al. "Pulsed nucleation for ultra-high aspect ratio tungsten plugfill", Novellus Systems, Inc. (2001), pp. 1-2.
Leskela, et al. "Atomic layer epitaxy in deposition of various oxide and nitride thin films", Colloque C5, Supplement au Journal de Physique II, vol. 5, Jun. 1995, pp. 937-951.
Martensson, et al. "Atomic Layer Epitaxy of Copper on Tantalum", Chemical Vapor Deposition, 3(1) (Feb. 1, 1997), pp. 45-50.
Martensson, et al. "Atomic Layer Epitaxy of Copper, Growth & Selectivity in the Cu (II)-2,2,6,6Tetramethyl-3, 5-Heptanedion ATE/$H_2$ Process", J. Electrochem. Soc., 145(8) (Aug. 1998), pp. 2926-2931.
Maydan "Cluster Tools for Fabrication of Advanced devices" Jap. J. of Applied Physics, Extended Abstracts, 22.sup.nd Conference Solid State Devices and Materials (1990), pp. 849-852.

(56) References Cited

OTHER PUBLICATIONS

McGeachin "Synthesis and properties of some .beta.-diketimines derived from acetylacetone, and their metal complexes", Canadian J. of Chemistry, vol. 46 (1968), pp. 1903-1912.

Min, et al. "Atomic Layer Deposition of TiN Thin Films by Sequential Introduction of Ti Precursor and $NH_3$," Mat. Res. Soc. Symp. Proc. vol. 514 (1998).

Min, et al. "Chemical Vapor Deposition of Ti—Si—N Films With Alternating Source Supply", Mat. Rec. Soc. Symp. Proc. vol. (1999), pp. 207-210.

Min, et al. "Metal-organic Atomic-layer Deposition of Titanium-silicon-nitride films", Applied Physics Letters, vol. 75, No. 11 (Sep. 13, 1999), pp. 1521-1523.

Nilnisto, et al. "Synthesis of Oxide Thin Films and Overlayers by Atomic Layer Epitaxy for Advanced Applications," Materials Science and Engineering B41 (1996) 23-29.

Ohba, et al. "Thermal Decomposition of Methylhydrazine and Deposition Properties of CVD TiN Thin Films", Conference Proceedings, Advanced Metallization for ULSI Applications in 1993 (1994), pp. 143-149.

Partial Search Report (Annex to Form PCT/ISA/206), dated Oct. 25, 2002 for PCT/U502/02651 (WO 02/063677).

Yamaguchi, et al. "Atomic-layer chemical-vapor-deposition of silicon dioxide films with extremely low hydrogen content", Appl. Surf. Sci., vol. 130-132 (1998), pp. 202-207.

Yang, et al. "Atomic Layer Deposition of Tungsten Film from $WF_6$/$B_2H_6$: Nucleation Layer for Advanced Semiconductor Device", Conference Proceedings ULSI XCII (2002) Materials Research Society, pp. 655-660.

"$Ta(N_tC_5H_{11})[N(CH_3)_2]$ Taimata .RTM.," http://c1005059.securesites.net/topic/Taimata/Taimata-E.htm, Jun. 13, 2007.

Goswami, et al. Transition Metals Show Promise as Copper Barriers, Semiconductor International, ATMI, San Jose—May 1, 2004.

Hong, et al. "Characteristics of PAALD-TaN thin films derived from Taimata precursor for copper metallization", Internconnect Technology Conference, 2004. Proceedings of the IEEE 2004 International, Jun. 7-9, 2004, pp. 9-11.

Park, et al. "Performance improvement of MOSFET with $HfO_2Al_2O_3$ laminate gate dielectric and CVD-TaN metal gate deposited by Taimata", Electron Devices Meeting, 2003. IEDM '03 Techinical Digest. IEEE International Dec. 8-10, 2003, pp. 13.6.1-13.6.4.

Shenai, et al. "Correlation of vapor pressure equation and film properties with trimethylindium purity for the MOVPE grown III-V compounds," Journal of Crystal Growth 248 (2003) pp. 91-98.

Notice of Reasons for Rejection dated Mar. 3, 2009 for Japanese Application No. 2003/538423.

Korean Office Action dated Sep. 11, 2009 for Application No. 10-2004-7006217.

Official Letter dated Oct. 10, 2012, from Japan Patent Office for corresponding Japan Patent Application No. 2010-205796.

Ritala, et al. "Atomic Layer Epitaxy Growth of TiN Thin Films", J. Electrochem. Soc., vol. 142, No. 8, Aug. 1995, pp. 2731-2737.

Ritala, et al. "Controlled growth of TaN, $Ta_3N_5$ and $TaO_{.x}N_y$, thin films by atomic layer deposition", Chem. Mater., vol. 11, No. 7, 1999, pp. 1712-1718.

Ritala, et al. "Perfectly Conformal TiN and $Al_2O_3$ Films Deposited by Atomic Layer Deposition", Chem. Vap. Deposition 1999, 5, No. 1, pp. 7-9.

Rossnagel, et al. "Plasma-enhanced atomic Layer deposition of Ta and Ti for Interconnect Diffusion Barriers", J. Vac. Sci. & Tech., 18(4) (Jul. 2000).

Scheper, et al. "Low-temperature deposition of titanium nitride films from dialkylhydrazine-based precursors", Material Science in Semiconductor Processing 2 (1999), pp. 149-157.

Solanki, et al. "Atomic Layer deposition of Copper Seed Layers", Electrochemical and Solid State Letters, 3(10) (2000), pp. 479-480.

Suzuki, et al. "A 0.2-.mu.m contact filing by 450.degree. C-hydrazine-reduced TiN film with low resistivity", IEDM 92-979, pp. 11.8.1-11.8.3, 1992.

Suzuki, et al. "LCVD-TiN Using Hydrazine and $TiCl_4$", VMIC Conference (Jun. 8-9, 1993), pp. 418-423.

Wise, et al. "Diethyldiethoxysilane as a new precursor for $SiO_2$ growth on silicon", Mat. Res. Soc. Symp. Proc., vol. 334 (1994), pp. 37-43.

Yamaga, et al. "Atomic layer epitaxy of ZnS by a new gas supplying system in a low-pressure metalorganic vapor phase epitaxy", J. of Crystal Growth 117 (1992), pp. 152-155.

Written opinion of PCT/US02/02651 dated May 23, 2012.

\* cited by examiner

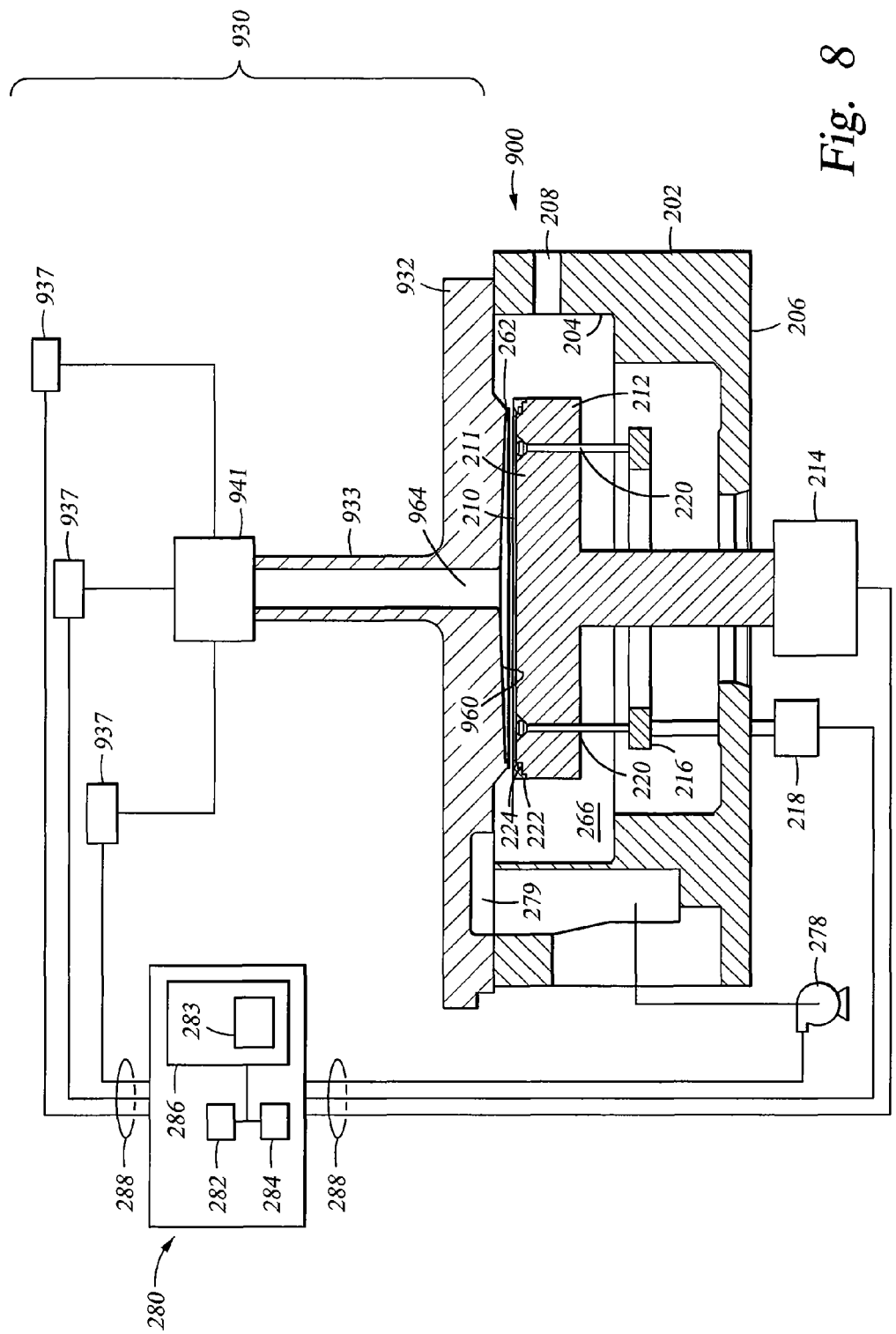

GAS DELIVERY APPARATUS AND METHOD FOR ATOMIC LAYER DEPOSITION

CROSS-REFERENCE TO RELATED APPLICATIONS

This application is a continuation of U.S. patent application Ser. No. 11/077,753, filed Mar. 11, 2005, now U.S. Pat. No. 7,780,788 which is a continuation of U.S. patent application Ser. No. 10/032,284, filed Dec. 21, 2001, now U.S. Pat. No. 6,916,398 which claims benefit of U.S. Provisional Patent Application Ser. No. 60/346,086, filed Oct. 26, 2001. Each of the aforementioned related patent applications is herein incorporated by reference.

FIELD

Embodiments of the present invention generally relate to an apparatus and method for atomic layer deposition. More particularly, embodiments of the present invention relate to an improved gas delivery apparatus and method for atomic layer deposition.

BACKGROUND

Reliably producing sub-micron and smaller features is one of the key technologies for the next generation of very large scale integration (VLSI) and ultra large scale integration (ULSI) of semiconductor devices. However, as the fringes of circuit technology are pressed, the shrinking dimensions of interconnects in VLSI and ULSI technology have placed additional demands on the processing capabilities. The multilevel interconnects that lie at the heart of this technology require precise processing of high aspect ratio features, such as vias and other interconnects. Reliable formation of these interconnects is very important to VLSI and ULSI success and to the continued effort to increase circuit density and quality of individual substrates.

As circuit densities increase, the widths of vias, contacts, and other features, as well as the dielectric materials between them, decrease to sub-micron dimensions (e.g., about 0.20 micrometers or less), whereas the thickness of the dielectric layers remains substantially constant, with the result that the aspect ratios for the features, i.e., their height divided by width, increase. Many traditional deposition processes have difficulty filling sub-micron structures where the aspect ratio exceeds 4:1, and particularly where the aspect ratio exceeds 10:1. Therefore, there is a great amount of ongoing effort being directed at the formation of substantially void-free and seam-free sub-micron features having high aspect ratios.

Atomic layer deposition is one deposition technique being explored for the deposition of material layers over features having high aspect ratios. One example of atomic layer deposition comprises the sequential introduction of pulses of gases. For instance, one cycle for the sequential introduction of pulses of gases may comprise a pulse of a first reactant gas, followed by a pulse of a purge gas and/or a pump evacuation, followed by a pulse of a second reactant gas, and followed by a pulse of a purge gas and/or a pump evacuation. The term "gas" as used herein is defined to include a single gas or a plurality of gases. Sequential introduction of separate pulses of the first reactant and the second reactant may result in the alternating self-limiting absorption of monolayers of the reactants on the surface of the substrate and, thus, forms a monolayer of material for each cycle. The cycle may be repeated to a desired thickness of the deposited material. A pulse of a purge gas and/or a pump evacuation between the pulses of the first reactant gas and the pulses of the second reactant gas serves to reduce the likelihood of gas phase reactions of the reactants due to excess amounts of the reactants remaining in the chamber.

However, there is a need for new apparatuses to perform gas delivery and to perform deposition of films by atomic layer deposition.

SUMMARY

Embodiments of the present invention relate to an improved gas delivery apparatus adapted for atomic layer deposition or rapid chemical vapor deposition. One embodiment of the gas delivery assembly comprises a covering member having an expanding channel at a central portion of the covering member and having a bottom surface extending from the expanding channel to a peripheral portion of the covering member. One or more gas conduits are coupled to the expanding channel in which the one or more gas conduits are positioned at an angle from a center of the expanding channel.

Another embodiment of the gas delivery assembly comprises a first valve and a second valve. The first valve includes a first delivery line and a first purge line. The first delivery line comprises a first reactant gas inlet, a first reactant gas outlet, and a first valve seat assembly. The first purge line comprises a first purge gas inlet and a first purge gas outlet. The first purge gas outlet of the first purge line is in communication with the first delivery line downstream of the first valve seat assembly. The second valve includes a second delivery line and a second purge line. The second delivery line comprises a second reactant gas inlet, a second reactant gas outlet, and a second valve seat assembly. The second purge line comprises a second purge gas inlet and a second purge gas outlet. The second purge gas outlet of the second purge line is in communication with the second delivery line downstream of the second valve seat assembly.

One embodiment of a chamber comprises a substrate support having a substrate receiving surface. The chamber further includes a chamber lid having a passageway at a central portion of the chamber lid and a tapered bottom surface extending from the passageway to a peripheral portion of the chamber lid. The bottom surface of the chamber lid is shaped and sized to substantially cover the substrate receiving surface. One or more valves are coupled to the passageway, and one or more gas sources are coupled to each valve. In one aspect, the bottom surface of the chamber lid may be tapered. In another aspect, a reaction zone defined between the chamber lid and the substrate receiving surface may comprise a small volume. In still another aspect, the passageway may comprise a tapered expanding channel extending from the central portion of the chamber lid.

Another embodiment of the chamber comprises a substrate support having a substrate receiving surface. The chamber further comprises a chamber lid having an expanding channel extending from a central portion of the chamber lid and having a tapered bottom surface extending from the expanding channel to a peripheral portion of the chamber lid. One or more gas conduits are disposed around an upper portion of the expanding channel in which the one or more gas conduits are disposed at an angle from a center of the expanding channel. A choke is disposed on the chamber lid adjacent a perimeter of the tapered bottom surface.

One embodiment of a method of depositing a material layer over a substrate structure comprises delivering a first reactant gas and a first purge gas through a first gas conduit in which the first reactant gas is provided in pulses and the first purge gas is provided in a continuous flow. The method further comprises delivering a second reactant gas and a second purge through a second gas conduit in which the second reactant gas is provided in pulses and the second purge gas is provided in a continuous flow.

One embodiment of a method of delivering gases to a substrate in a substrate processing chamber comprises providing one or more gases into the substrate processing chamber, reducing a velocity of the gases through non-adiabatic expansion, providing the gases to a central portion of the substrate, and directing the gases radially across the substrate from the central portion of the substrate to a peripheral portion of the substrate.

Another embodiment of a method of delivering gases to a substrate in a substrate processing chamber comprises providing one or more gases to a central portion of the substrate and directing the gases radially at a substantially uniform velocity across the substrate from the central portion of the substrate to a peripheral portion of the substrate.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 8 shows another embodiment of a chamber including a gas delivery apparatus adapted for atomic layer deposition.

DETAILED DESCRIPTION

Figure 1:
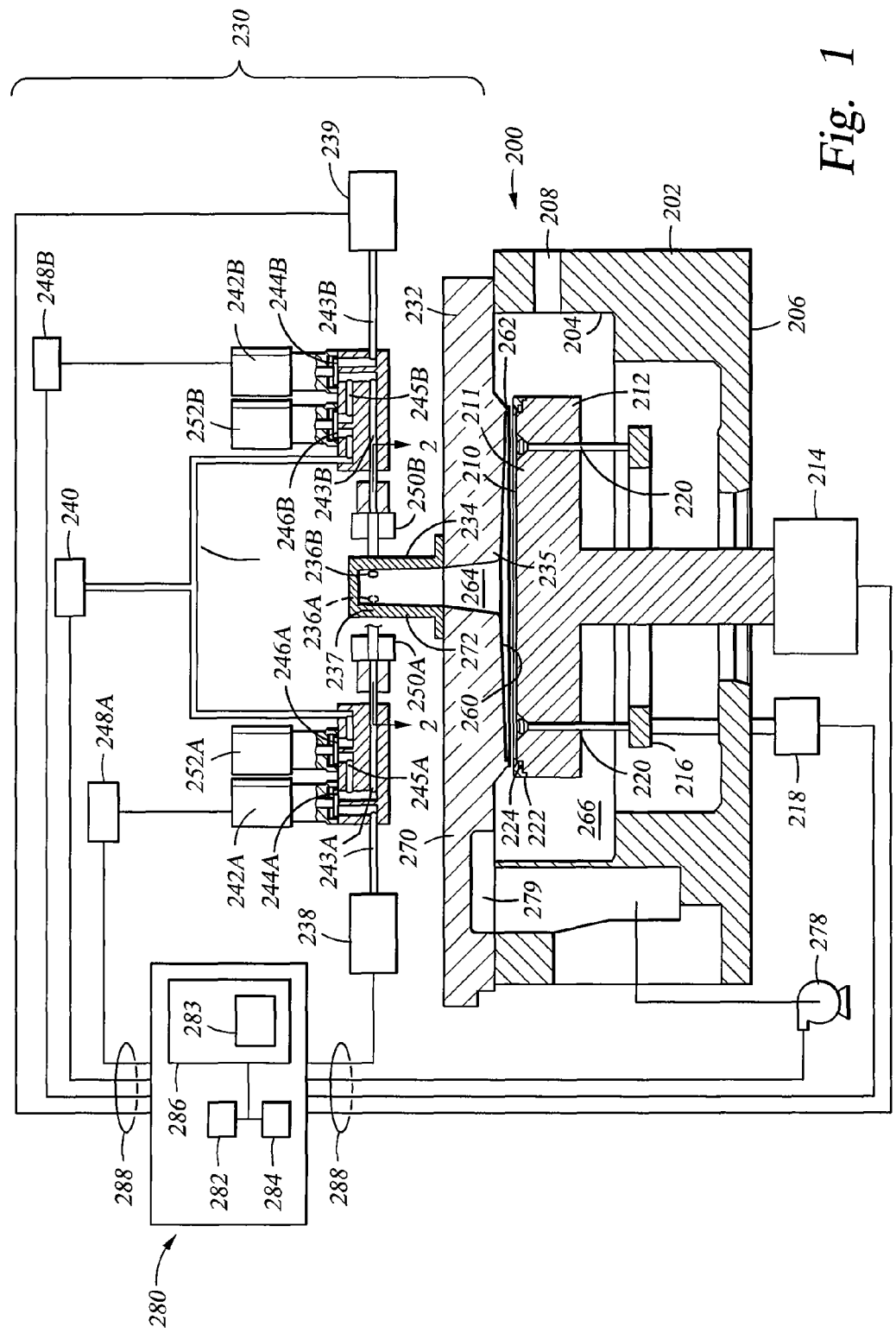
FIG. 1 is a schematic cross-sectional view of one embodiment of a chamber including a gas delivery apparatus adapted for atomic layer deposition.

FIG. 1 is a schematic cross-sectional view of one embodiment of a chamber 200 including a gas delivery apparatus 230 adapted for atomic layer deposition or rapid chemical vapor deposition. The term "atomic layer deposition" and "rapid chemical vapor deposition" as used herein refer to the sequential introduction of reactants to deposit a thin layer over a substrate structure. The sequential introduction of reactants may be repeated to deposit a plurality of thin layers to form a conformal layer to a desired thickness. The chamber 200 may also be adapted for other deposition techniques.

The chamber 200 comprises a chamber body 202 having sidewalls 204 and a bottom 206. A slit valve 208 in the chamber 200 provides access for a robot (not shown) to deliver and retrieve a substrate 210, such as a 200 mm or 300 mm semiconductor wafer or a glass substrate, to and from the chamber 200.

A substrate support 212 supports the substrate 210 on a substrate receiving surface 211 in the chamber 200. The substrate support 212 is mounted to a lift motor 214 to raise and lower the substrate support 212 and a substrate 210 disposed thereon. A lift plate 216 connected to a lift motor 218 is mounted in the chamber 200 and raises and lowers lift pins 220 movably disposed through the substrate support 212. The lift pins 220 raise and lower the substrate 210 over the surface of the substrate support 212. The substrate support 212 may include a vacuum chuck (not shown), an electrostatic chuck (not shown), or a clamp ring (not shown) for securing the substrate 210 to the substrate support 212 during processing.

The substrate support 212 may be heated to heat a substrate 210 disposed thereon. For example, the substrate support 212 may be heated using an embedded heating element, such as a resistive heater (not shown), or may be heated using radiant heat, such as heating lamps (not shown) disposed above the substrate support 212. A purge ring 222 may be disposed on the substrate support 212 to define a purge channel 224 which provides a purge gas to a peripheral portion of the substrate 210 to prevent deposition thereon.

A gas delivery apparatus 230 is disposed at an upper portion of the chamber body 202 to provide a gas, such as a process gas and/or a purge gas, to the chamber 200. A vacuum system 278 is in communication with a pumping channel 279 to evacuate any desired gases from the chamber 200 and to help maintain a desired pressure or a desired pressure range inside a pumping zone 266 of the chamber 200.

In one embodiment, the gas delivery apparatus 230 comprises a chamber lid 232. The chamber lid 232 includes an expanding channel 234 extending from a central portion of the chamber lid 232 and a bottom surface 260 extending from the expanding channel 234 to a peripheral portion of the chamber lid 232. The bottom surface 260 is sized and shaped to substantially cover a substrate 210 disposed on the substrate support 212. The expanding channel 234 has gas inlets 236A, 236B to provide gas flows from two similar pairs of valves 242A/252A, 242B/252B, which may be provided together and/or separately.

In one configuration, valve 242A and valve 242B are coupled to separate reactant gas sources but are preferably coupled to the same purge gas source. For example, valve 242A is coupled to reactant gas source 238 and valve 242B is coupled to reactant gas source 239, and both valves 242A, 242B are coupled to purge gas source 240. Each valve 242A, 242B includes a delivery line 243A, 243B having a valve seat assembly 244A, 244B and each valves 252A, 252B includes a purge line 245A, 245B having a valve seat assembly 246A, 246B. The delivery line 243A, 243B is in communication with the reactant gas source 238, 239 and is in communication with the gas inlet 236A, 236B of the expanding channel 234. The valve seat assembly 244A, 244B of the delivery line 243A, 243B controls the flow of the reactant gas from the reactant gas source 238, 239 to the expanding channel 234. The purge line 245A, 245B is in communication with the purge gas source 240 and intersects the delivery line 243A, 243B downstream of the valve seat assembly 244A, 244B of the delivery line 243A, 243B. The valve seat assembly 246A, 246B of the purge line 245A, 245B controls the flow of the purge gas from the purge gas source 240 to the expanding channel 234. If a carrier gas is used to deliver reactant gases from the reactant gas source 238, 239, preferably the same gas is used as a carrier gas and a purge gas (i.e., an argon gas used as a carrier gas and a purge gas).

Each valve seat assembly 244A, 244B, 246A, 246B may comprise a diaphragm (not shown) and a valve seat (not shown). The diaphragm may be biased open or closed and may be actuated closed or open respectively. The diaphragms may be pneumatically actuated or may be electrically actuated. Examples of pneumatically actuated valves include pneumatically actuated valves available from Fujiken, Inc. and Veriflow, Corp. Examples of electrically actuated valves include electrically actuated valves available from Fujiken, Inc. Programmable logic controllers 248A, 248B may be coupled to the valves 242A, 242B to control actuation of the diaphragms of the valve seat assemblies 244A, 244B, 246A, 246B of the valves 242A, 242B. Pneumatically actuated valves may provide pulses of gases in time periods as low as about 0.020 seconds. Electrically actuated valves may provide pulses of gases in time periods as low as about 0.005 seconds. An electrically actuated valve typically requires the use of a driver coupled between the valve and the programmable logic controller.

Each valve 242A, 242B may be a zero dead volume valve to enable flushing of a reactant gas from the delivery line 243A, 243B when the valve seat assembly 244A, 244B is closed. For example, the purge line 245A, 245B may be positioned adjacent the valve seat assembly 244A, 244B of the delivery line 243A, 243B. When the valve seat assembly 244A, 244B is closed, the purge line 245A, 245B may provide a purge gas to flush the delivery line 243A, 243B. In the embodiment shown, the purge line 245A, 245B is positioned slightly spaced from the valve seat assembly 244A, 244B of the delivery line 243A, 243B so that a purge gas is not directly delivered into the valve seat assembly 244A, 244B when open. A zero dead volume valve as used herein is defined as a valve which has negligible dead volume (i.e., not necessary zero dead volume).

Each valve pair 242A/252A, 242B/252B may be adapted to provide a combined gas flow and/or separate gas flows of the reactant gas and the purge gas. In reference to valve pair 242A/252A, one example of a combined gas flow of the reactant gas and the purge gas comprises a continuous flow of a purge gas from the purge gas source 240 through purge line 245A and pulses of a reactant gas from the reactant gas source 238 through delivery line 243A. The continuous flow of the purge gas may be provided by leaving the diaphragm of the valve seat assembly 246A of the purge line 245A open. The pulses of the reactant gas from the reactant gas source 238 may be provided by opening and closing the diaphragm of the valve seat assembly 244A of the delivery line 243A. In reference to valve pair 242A/252A, one example of separate gas flows of the reactant gas and the purge gas comprises pulses of a purge gas from the purge gas source 240 through purge line 245A and pulses of a reactant gas from the reactant gas source 238 through delivery line 243A. The pulses of the purge gas may be provided by opening and closing the diaphragm of the valve seat assembly 246A of the purge line 245A. The pulses of the reactant gas from the reactant gas source 238 may be provided by opening and closing the diaphragm of the valve seat assembly 244A of the delivery line 243A.

The delivery lines 243A, 243B of the valves 242A, 242B may be coupled to the gas inlets 236A, 236B through gas conduits 250A, 250B. The gas conduits 250A, 250B may be integrated or may be separate from the valves 242A, 242B. In one aspect, the valves 242A, 242B are coupled in close proximity to the expanding channel 234 to reduce any unnecessary volume of the delivery line 243A, 243B and the gas conduits 250A, 250B between the valves 242A, 242B and the gas inlets 236A, 236B.

Figure 3:
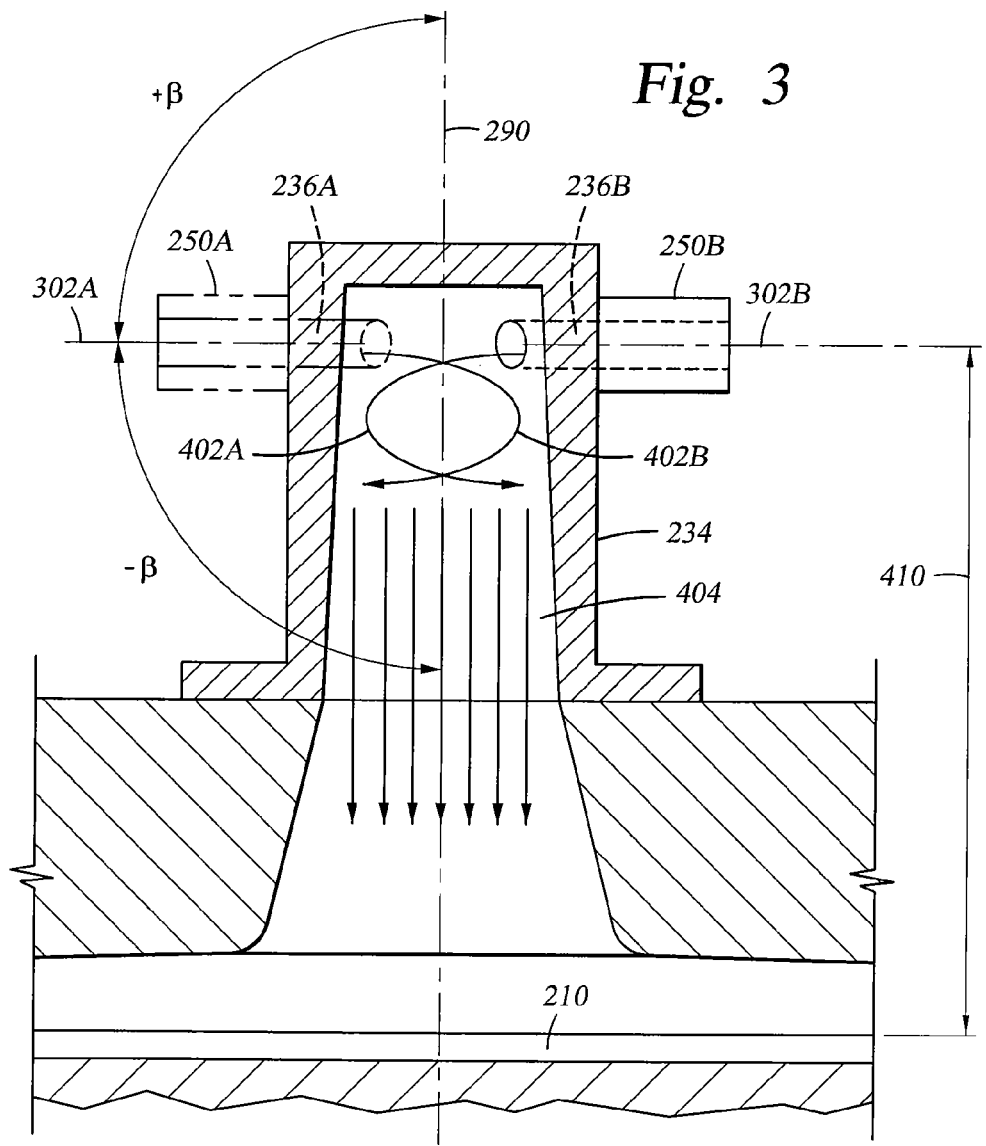
FIG. 3 is a cross-sectional view of the expanding channel of the chamber lid of FIG. 1.

In reference to FIG. 3, each gas conduit 250A, 250B and gas inlet 236A, 236B may be positioned in any relationship to a longitudinal axis 290 of the expanding channel 234. Each gas conduit 250A, 250B and gas inlet 236A, 236B are preferably positioned normal (in which $+\beta$, $-\beta=90°$ to the longitudinal axis 290 or positioned at an angle $+\beta$ or an angle $-\beta$ (in which $0°<+\beta<90°$ or $0°<-\beta<90°$) from the centerline 302A, 302B of the gas conduit 250A, 250B to the longitudinal axis 290. Therefore, the gas conduit 250A, 250B may be positioned horizontally normal to the longitudinal axis 290 as shown in FIG. 3, may be angled downwardly at an angle $+\beta$, or may be angled upwardly at an angle $-\beta$ to provide a gas flow toward the walls of the expanding channel 234 rather than directly downward towards the substrate 210 which helps reduce the likelihood of blowing off reactants adsorbed on the surface of the substrate 210. In addition, the diameter of the gas conduits 250A, 250B may be increasing from the delivery lines 243A, 243B of the valves 242A, 242B to the gas inlet 236A, 236B to help reduce the velocity of the gas flow prior to its entry into the expanding channel 234. For example, the gas conduits 250A, 250B may comprise an inner diameter which is gradually increasing or may comprise a plurality of connected conduits having increasing inner diameters.

Referring to FIG. 1, the expanding channel 234 comprises a channel which has an inner diameter which increases from an upper portion 237 to a lower portion 235 of the expanding channel 234 adjacent the bottom surface 260 of the chamber lid 232. In one specific embodiment, the inner diameter of the expanding channel 234 for a chamber adapted to process 200 mm diameter substrates is between about 0.2 inches and about 1.0 inch, preferably between about 0.3 inches and about 0.9 inches, and more preferably between 0.3 inches and about 0.5 inches at the upper portion 237 of the expanding channel 234 and between about 0.5 inches and about 3.0 inches, preferably between about 0.75 inches and about 2.5 inches, and more preferably between about 1.1 inches and about 2.0 inches at the lower portion 235 of the expanding channel 234. In another specific embodiment, the inner diameter of the expanding channel 234 for a chamber adapted to process 300 mm diameter substrates is between about 0.2 inches and about 1.0 inch, preferably between about 0.3 inches and about 0.9 inches, and more preferably between 0.3 inches and about 0.5 inches at the upper portion 237 of the expanding channel 234 and between about 0.5 inches and about 3.0 inches, preferably between about 0.75 inches and about 2.5 inches, and more preferably between about 1.2 inches and about 2.2 inches at the lower portion 235 of the expanding channel 234. In general, the above dimension apply to an expanding channel adapted to provide a total gas flow of between about 500 sccm and about 3,000 sccm. In other specific embodiments, the dimension may be altered to accommodate a certain gas flow therethough. In general, a larger gas flow will require a larger diameter expanding channel. In one embodiment, the expanding channel 234 may be shaped as a truncated cone (including shapes resembling a truncated cone). Whether a gas is provided toward the walls of the expanding channel 234 or directly downward towards the substrate 210, the velocity of the gas flow decreases as the gas flow travels through the expanding channel 234 due to the expansion of the gas. The reduction of the velocity of the gas flow helps reduce the likelihood the gas flow will blow off reactants adsorbed on the surface of the substrate 210.

Not wishing to be bound by theory, it is believed that the diameter of the expanding channel 234, which is gradually increasing from the upper portion 237 to the lower portion 235 of the expanding channel 234, allows less of an adiabatic expansion of a gas through the expanding channel 234 which helps to control the temperature of the gas. For instance, a sudden adiabatic expansion of a gas delivered through the gas inlet 236A, 236B into the expanding channel 234 may result in a drop in the temperature of the gas which may cause condensation of the gas and formation of droplets. On the other hand, a gradually expanding channel 234 according to embodiments of the present invention is believed to provide less of an adiabatic expansion of a gas. Therefore, more heat may be transferred to or from the gas, and, thus, the temperature of the gas may be more easily controlled by controlling the surrounding temperature of the gas (i.e., controlling the temperature of the chamber lid 232). The gradually expanding channel 234 may comprise one or more tapered inner surfaces, such as a tapered straight surface, a concave surface, a convex surface, or combinations thereof or may comprise sections of one or more tapered inner surfaces (i.e., a portion tapered and a portion non-tapered).

In one embodiment, the gas inlets 236A, 236B are located adjacent the upper portion 237 of the expanding channel 234. In other embodiments, one or more gas inlets 236A, 236B may be located along the length of the expanding channel 234 between the upper portion 237 and the lower portion 235.

Figure 2:
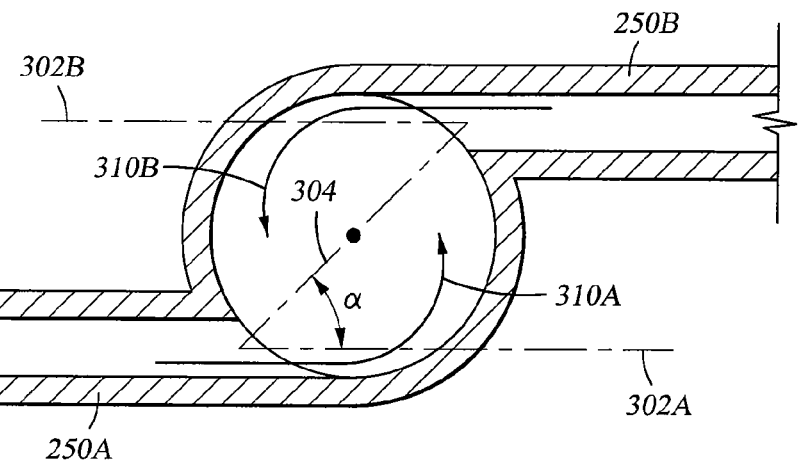
FIG. 2 is a top cross-sectional view of one embodiment of the expanding channel of the chamber lid of FIG. 1.

FIG. 2 is a top cross-sectional view of one embodiment of the expanding section 234 of the chamber lid 232 of FIG. 1. Each gas conduit 250A, 250B may be positioned at an angle α from the centerline 302A, 302B of the gas conduit 250A, 250B and from a radius line 304 from the center of the expanding channel 234. Entry of a gas through the gas conduit 250A, 250B preferably positioned at an angle α (i.e., when α>0°) causes the gas to flow in a circular direction as shown by arrows 310A and 310B. Providing gas at an angle α as opposed to directly straight-on to the walls of the expanding channel (i.e., when α=0°) helps to provide a more laminar flow through the expanding channel 234 rather than a turbulent flow. It is believed that a laminar flow through the expanding channel 234 results in an improved purging of the inner surface of the expanding channel 234 and other surfaces of the chamber lid 232. In comparison, a turbulent flow may not uniformly flow across the inner surface of the expanding channel 234 and other surfaces and may contain dead spots or stagnant spots in which there is no gas flow. In one aspect, the gas conduits 250A, 250B and the corresponding gas inlets 236A, 236B are spaced out from each other and direct a flow in the same circular direction (i.e., clockwise or counterclockwise).

Not wishing to be bound by theory, FIG. 3 is a cross-sectional view of the expanding channel 234 of a chamber lid 232 showing simplified representations of two gas flows therethrough. Although the exact flow pattern through the expanding channel 234 is not known, it is believed that the circular flow 310 (FIG. 2, arrows 310A and 310B) may travel as a "vortex," "helix," or "spiral" flow through the expanding channel 234 as shown by arrows 402A, 402B (hereinafter "vortex" flow 402). As shown in FIG. 3, the circular flow may be provided in a "processing region" as opposed to in a compartment separated from the substrate 210. In one aspect, the vortex flow may help to establish a more efficient purge of the expanding channel 234 due to the sweeping action of the vortex flow pattern across the inner surface of the expanding channel 234.

In one embodiment, the distance 410 between the gas inlets 236A, 236B and the substrate 210 is made long enough that the "vortex" flow 402 dissipates to a downwardly flow as shown by arrows 404 as a spiral flow across the surface of the substrate 210 may not be desirable. It is believed that the "vortex" flow 402 and the downwardly flow 404 proceeds in a laminar manner efficiently purging the surface of the chamber lid 232 and the substrate 210. In one specific embodiment the distance 410 between the upper portion 237 of the expanding channel 234 and the substrate 210 is about 1.0 inch or more, more preferably about 2.0 inches or more. In one specific embodiment, the upper limit of the distance 410 is dictated by practical limitations. For example, if the distance 410 is very long, then the residence time of a gas traveling through the expanding channel 234 would be long, then the time for a gas to deposit onto the substrate would be long, and then throughput would be low. In addition, if distance 410 is very long, manufacturing of the expanding channel 234 would be difficult. In general, the upper limit of distance 410 may be 3 inches or more for a chamber adapted to process 200 mm diameter substrates or 5 inches or more for a chamber adapted to process 300 mm diameter substrates.

Referring to FIG. 1, at least a portion of the bottom surface 260 of the chamber lid 232 may be tapered from the expanding channel 234 to a peripheral portion of the chamber lid 232 to help provide an improved velocity profile of a gas flow from the expanding channel 234 across the surface of the substrate 210 (i.e., from the center of the substrate to the edge of the substrate). The bottom surface 260 may comprise one or more tapered surfaces, such as a straight surface, a concave surface, a convex surface, or combinations thereof. In one embodiment, the bottom surface 260 is tapered in the shape of a funnel.

Figure 4:
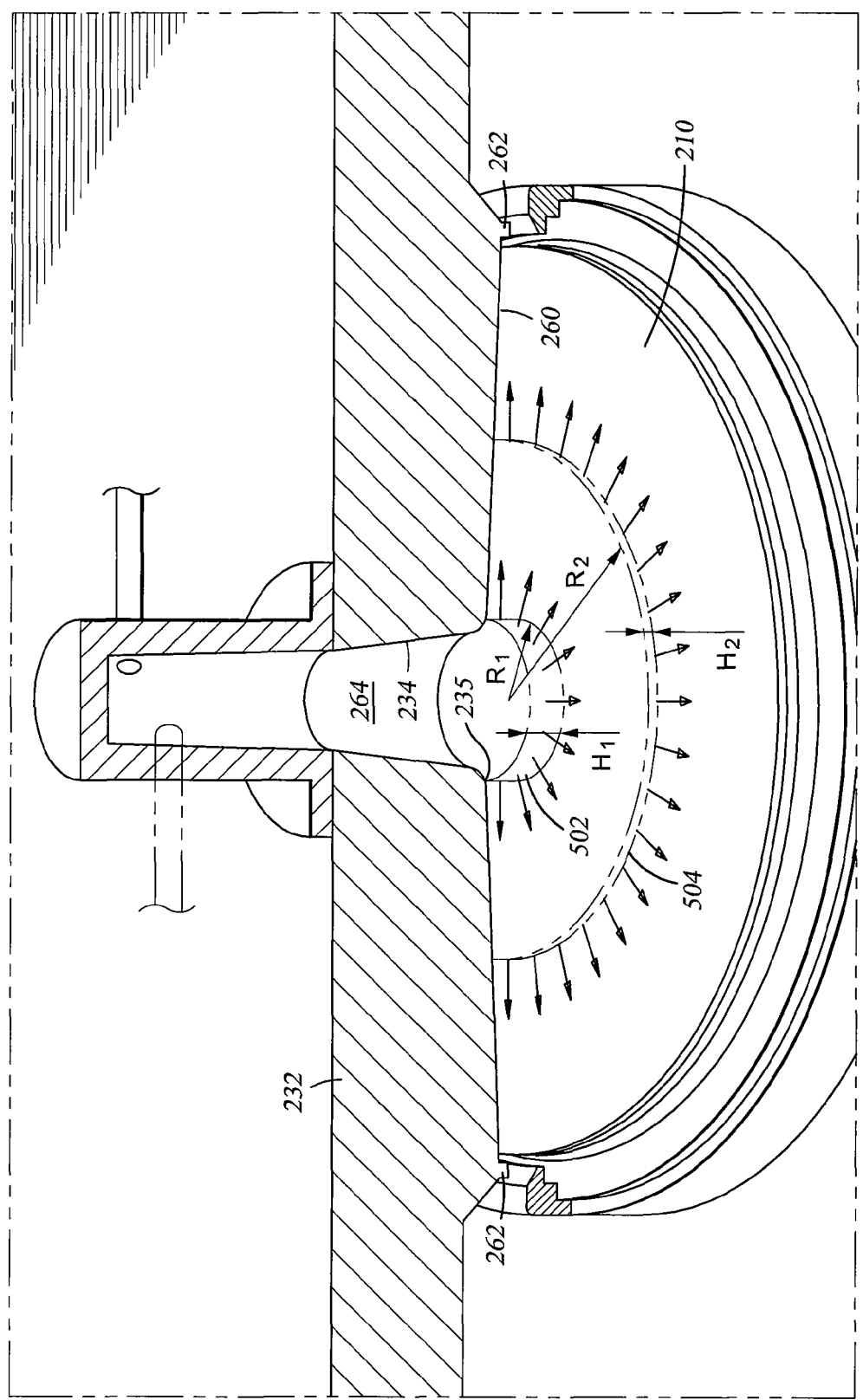
FIG. 4 is a schematic cross-sectional view illustrating the flow of a gas at two different positions between the surface of a substrate and the bottom surface of the chamber lid of FIG. 1.

Not wishing to be bound by theory, FIG. 4 is schematic view illustrating the flow of a gas at two different positions 502, 504 between the bottom surface 260 of the chamber lid 232 and the surface of a substrate 210. The velocity of the gas at a certain position is theoretically determined by the equation below:

$$Q/A = V \quad (1)$$

In which, "Q" is the flow of the gas, "A" is the area of the flow section, and "V" is the velocity of the gas. The velocity of the gas is inversely proportional to the area "A" of the flow section ($H_x 2\pi R$), in which "H" is the height of the flow section and "$2\pi R$" is the circumference of the flow section having a radius "R". In other words, the velocity of a gas is inversely proportional to the height "H" of the flow section and the radius "R" of the flow section.

Comparing the velocity of the flow section at position 502 and position 504, assuming that the flow "Q" of the gas at all positions between the bottom surface 260 of the chamber lid 232 and the surface of the substrate 210 is equal, the velocity of the gas may be theoretically made equal by having the area "A" of the flow sections equal. For the area of flow sections at position 502 and position 504 to be equal, the height $H_1$ at position 502 must be greater than the height $H_2$ at position 504.

In one aspect, the bottom surface 260 is downwardly sloping to help reduce the variation in the velocity of the gases as it travels between the bottom surface 260 of the chamber lid 232 and the substrate 210 to help provide uniform exposure of the surface of the substrate 210 to a reactant gas. In one embodiment, the ratio of the maximum area of the flow section over the minimum area of the flow section between a downwardly sloping bottom surface 260 of the chamber lid 232 and the surface of the substrate 210 is less than about 2, preferably less than about 1.5, more preferably less than about 1.3, and most preferably about 1.

Not wishing to be bound by theory, it is believed that a gas flow traveling at a more uniform velocity across the surface of the substrate 210 helps provide a more uniform deposition of the gas on the substrate 210. It is believed that the velocity of the gas is directly proportional to the concentration of the gas which is in turn directly proportional to the deposition rate of the gas on the substrate 210 surface. Thus, a higher velocity of a gas at a first area of the surface of the substrate 210 versus a second area of the surface of the substrate 210 is believed to provide a higher deposition of the gas on the first area. It is believed that a chamber lid 232 having a downwardly sloping bottom surface 260 provides for more uniform deposition of the gas across the surface of the substrate 210 because the downwardly sloping bottom surface 260 provides a more uniform velocity and, thus, a more uniform concentration of the gas across the surface of the substrate 210.

Figure 9A:
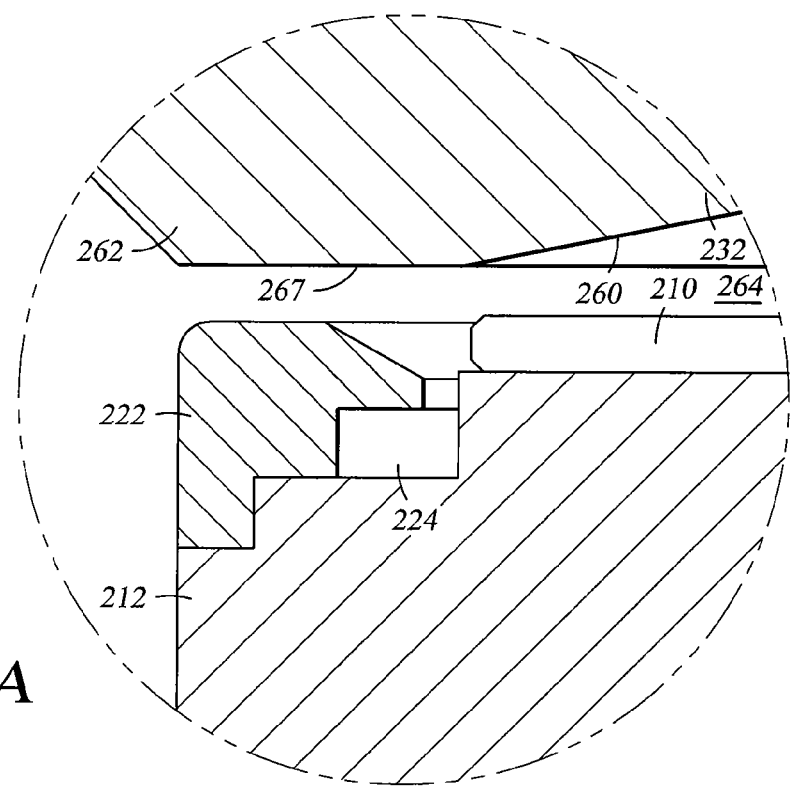
FIG. 9A is a schematic cross-sectional view of one embodiment of the choke of the chamber lid.
Figure 9B:
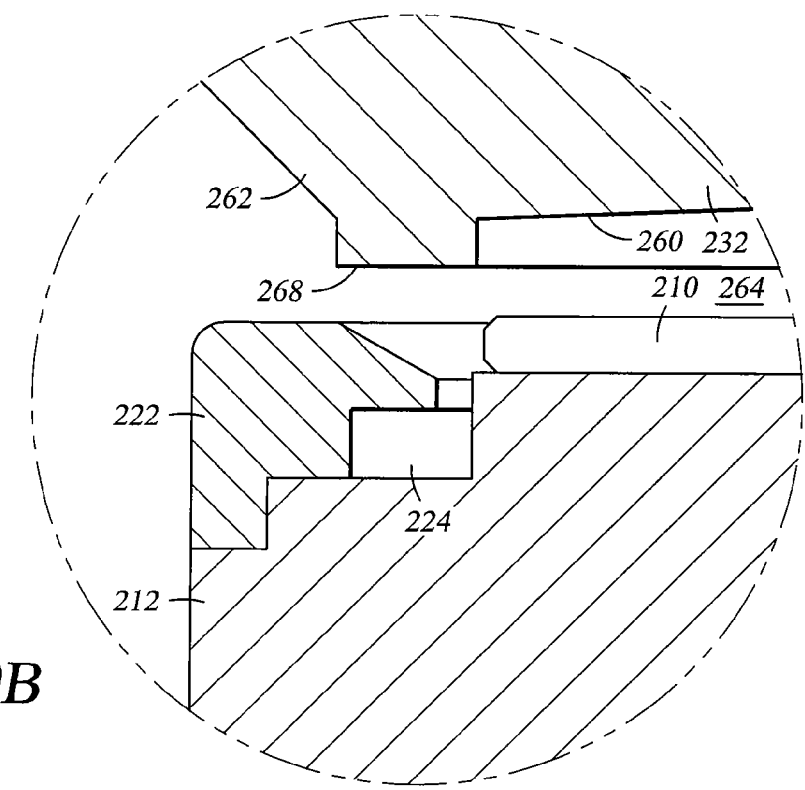
FIG. 9B is a cross-sectional view of another embodiment of the choke of the chamber lid.

Referring to FIG. 1, the chamber lid 232 may have a choke 262 at a peripheral portion of the chamber lid 232 adjacent the periphery of the substrate 210. The choke 262, when the chamber lid 232 is assembled to form a processing zone around the substrate 210, comprises any member restricting the flow of gas therethrough at an area adjacent the periphery of the substrate 210. FIG. 9A is a schematic cross-sectional view of one embodiment of the choke 262. In this embodiment, the choke 262 comprises a circumferential lateral portion 267. In one aspect, the purge ring 222 may be adapted to direct a purge gas toward the lateral portion 267 of the choke 262. FIG. 9B is a schematic cross-sectional view of another embodiment of the choke 262. In this embodiment, the choke 262 comprises a circumferential downwardly extending protrusion 268. In one aspect, the purge ring 222 may be adapted to direct a purge gas toward the circumferential downwardly extending protrusion 268. In one specific embodiment, the thickness of the downwardly extending protrusion 268 is between about 0.01 inches and about 1.0 inch, more preferably between 0.01 inches and 0.5 inches.

In one specific embodiment, the spacing between the choke 262 and the substrate support 212 is between about 0.04 inches and about 2.0 inches, and preferably between 0.04 inches and about 0.2 inches. The spacing may vary depending on the gases being delivered and the process conditions during deposition. The choke 262 helps provide a more uniform pressure distribution within the volume or a reaction zone 264 defined between the chamber lid 232 and the substrate 210 by isolating the reaction zone 264 from the non-uniform pressure distribution of the pumping zone 266 (FIG. 1).

Referring to FIG. 1, in one aspect, since the reaction zone 264 is isolated from the pumping zone 266, a reactant gas or purge gas needs only adequately fill the reaction zone 264 to ensure sufficient exposure of the substrate 210 to the reactant gas or purge gas. In conventional chemical vapor deposition, prior art chambers are required to provide a combined flow of reactants simultaneously and uniformly to the entire surface of the substrate in order to ensure that the co-reaction of the reactants occurs uniformly across the surface of the substrate 210. In atomic layer deposition, the present chamber 200 sequentially introduces reactants to the surface of substrate 210 to provide absorption of alternating thin layers of the reactants onto the surface of the substrate 210. As a consequence, atomic layer deposition does not require a flow of a reactant which reaches the surface of the substrate 210 simultaneously. Instead, a flow of a reactant needs to be provided in an amount which is sufficient to adsorb a thin layer of the reactant on the surface of the substrate 210.

Since the reaction zone 264 may comprise a smaller volume when compared to the inner volume of a conventional CVD chamber, a smaller amount of gas is required to fill the reaction zone 264 for a particular process in an atomic layer deposition sequence. For example, in one embodiment, the volume of the reaction zone 264 is about 1,000 $cm^3$ or less, preferably 500 $cm^3$ or less, and more preferably 200 $cm^3$ or less for a chamber adapted to process 200 mm diameter substrates. In one embodiment, the volume of the reaction zone 264 is about 3,000 $cm^3$ or less, preferably 1,500 $cm^3$ or less, and more preferably 600 $cm^3$ or less for a chamber adapted to process 300 mm diameter substrates. In one embodiment, the substrate support 212 may be raised or lowered to adjust the volume of the reaction zone 264 for deposition. Because of the smaller volume of the reaction zone 264, less gas, whether a deposition gas or a purge gas, is necessary to be flowed into the chamber 200. Therefore, the throughput of the chamber 200 is greater and the waste may be minimized due to the smaller amount of gas used reducing the cost of operation.

The chamber lid 232 has been shown in FIGS. 1-4 as comprising a cap portion 272 and a chamber plate portion 270 in which the cap portion 272 and the chamber plate portion 270 form the expanding channel 234. An additional plate may be optionally disposed between the chamber plate portion 270 and the cap portion 272. In other embodiments, the expanding channel 234 may be made integrally from a single piece of material.

The chamber lid 232 may include cooling elements and/or heating elements depending on the particular gas being delivered therethrough. Controlling the temperature of the chamber lid 232 may be used to prevent gas decomposition, deposition, or condensation on the chamber lid 232. For example, water channels (not shown) may be formed in the chamber lid 232 to cool the chamber lid 232. In another example, heating elements (not shown) may be embedded or may surround components of the chamber lid 232 to heat the chamber lid 232. In one embodiment, components of the chamber lid 232 may be individually heated or cooled. For example, referring to FIG. 1, the chamber lid 232 may comprise a chamber plate portion 270 and a cap portion 272 in which the chamber plate portion 270 and the cap portion 272 form the expanding channel 234. The cap portion 272 may be maintained at one temperature range and the chamber plate portion 270 may be maintained at another temperature range. For example, the cap portion 272 may be heated by being wrapped in heater tape or by using another heating device to prevent condensation of reactant gases and the chamber plate portion 270 may be maintained at ambient temperature. In another example, the cap portion 272 may be heated and the chamber plate portion 270 may be cooled with water channels formed therethrough to prevent thermal decomposition of reactant gases on the chamber plate portion 270.

The chamber lid 232 may be made of stainless steel, aluminum, nickel-plated aluminum, nickel, or other suitable materials compatible with the processing to be performed. In one embodiment, the cap portion 272 comprises stainless steel and the chamber plate portion 270 comprises aluminum. In one embodiment, the optional additional plate disposed therebetween comprises stainless steel. In one embodiment, the expanding channel 234 and the bottom surface 260 of the chamber lid 232 may comprise a mirror polished surface to help produce a laminar flow of a gas along the expanding channel 234 and the bottom surface 260 of the chamber lid 232. In another embodiment, the inner surface of the gas conduits 250A, 250B may be electropolished to help produce a laminar flow of a gas therethrough.

Returning to FIG. 1, a control unit 280, such as a programmed personal computer, work station computer, or the like, may be coupled to the chamber 200 to control processing conditions. For example, the control unit 280 may be configured to control flow of various process gases and purge gases from gas sources 238, 239, 240 through the valves 242A, 242B during different stages of a substrate process sequence. Illustratively, the control unit 280 comprises a central processing unit (CPU) 282, support circuitry 284, and memory 286 containing associated control software 283.

The control unit 280 may be one of any form of general purpose computer processor that can be used in an industrial setting for controlling various chambers and sub-processors. The CPU 282 may use any suitable memory 286, such as random access memory, read only memory, floppy disk drive, hard disk, or any other form of digital storage, local or remote. Various support circuits may be coupled to the CPU 282 for supporting the chamber 200. The control unit 280 may be coupled to another controller that is located adjacent individual chamber components, such as the programmable logic controllers 248A, 248B of the valves 242A, 242B. Bi-directional communications between the control unit 280 and various other components of the chamber 200 are handled through numerous signal cables collectively referred to as signal buses 288, some of which are illustrated in FIG. 1. In addition to control of process gases and purge gases from gas sources 238, 239, 240 and from the programmable logic controllers 248A, 248B of the valves 242A, 242B, the control unit 280 may be configured to be responsible for automated control of other activities used in wafer processing—such as wafer transport, temperature control, chamber evacuation, among other activities, some of which are described elsewhere herein.

Referring to FIGS. 1-4, in operation, a substrate 210 is delivered to the chamber 200 through the slit valve 208 by a robot (not shown). The substrate 210 is positioned on the substrate support 212 through cooperation of the lift pins 220 and the robot. The substrate support 212 raises the substrate 210 into close opposition to the bottom surface 260 of the chamber lid 232. A first gas flow may be injected into the expanding channel 234 of the chamber 200 by valve 242A together or separately (i.e., pulses) with a second gas flow injected into the chamber 200 by valve 242B. The first gas flow may comprise a continuous flow of a purge gas from purge gas source 240 and pulses of a reactant gas from reactant gas source 238 or may comprise pulses of a reactant gas from reactant gas source 238 and pulses of a purge gas from purge gas source 240. The second gas flow may comprises a continuous flow of a purge gas from purge gas source 240 and pulses of a reactant gas from reactant gas source 239 or may comprise pulses of a reactant gas from reactant gas source 239 and pulses of a purge gas from purge gas source 240. The gas flow travels through the expanding channel 234 as a pattern of vortex flow 402 which provides a sweeping action across the inner surface of the expanding channel 234. The pattern of vortex flow 402 dissipates to a downwardly flow 404 toward the surface of the substrate 210. The velocity of the gas flow reduces as it travels through the expanding channel 234. The gas flow then travels across the surface of the substrate 210 and across the bottom surface 260 of the chamber lid 232. The bottom surface 260 of the chamber lid 232, which is downwardly sloping, helps reduce the variation of the velocity of the gas flow across the surface of the substrate 210. The gas flow then travels by the choke 262 and into the pumping zone 266 of the chamber 200. Excess gas, by-products, etc. flow into the pumping channel 279 and are then exhausted from the chamber 200 by a vacuum system 278. In one aspect, the gas flow proceeds through the expanding channel 234 and between the surface of the substrate 210 and the bottom surface 260 of the chamber lid 232 in a laminar manner which aids in uniform exposure of a reactant gas to the surface of the substrate 210 and efficient purging of inner surfaces of the chamber lid 232.

Chamber 200 as illustrated in FIGS. 1-4 has been described herein as having a combination of features. In one aspect, chamber 200 provides a reaction zone 264 comprising a small volume in compared to a conventional CVD chamber. The chamber 200 requires a smaller amount of a gas, such as a reactant gas or a purge gas, to fill the reaction zone 264 for a particular process. In another aspect, chamber 200 provides a chamber lid 232 having a downwardly sloping or funnel shaped bottom surface 260 to reduce the variation in the velocity profile of a gas flow traveling between the bottom surface of the chamber lid 232 and a substrate 210. In still another aspect, the chamber 200 provides an expanding channel 234 to reduce the velocity of a gas flow introduced therethrough. In still another aspect, the chamber 200 provides gas conduits at an angle $\alpha$ from the center of the expanding channel 234. The chamber 200 provides other features as described elsewhere herein. Other embodiments of a chamber adapted for atomic layer deposition incorporate one or more of these features.

Figure 7:
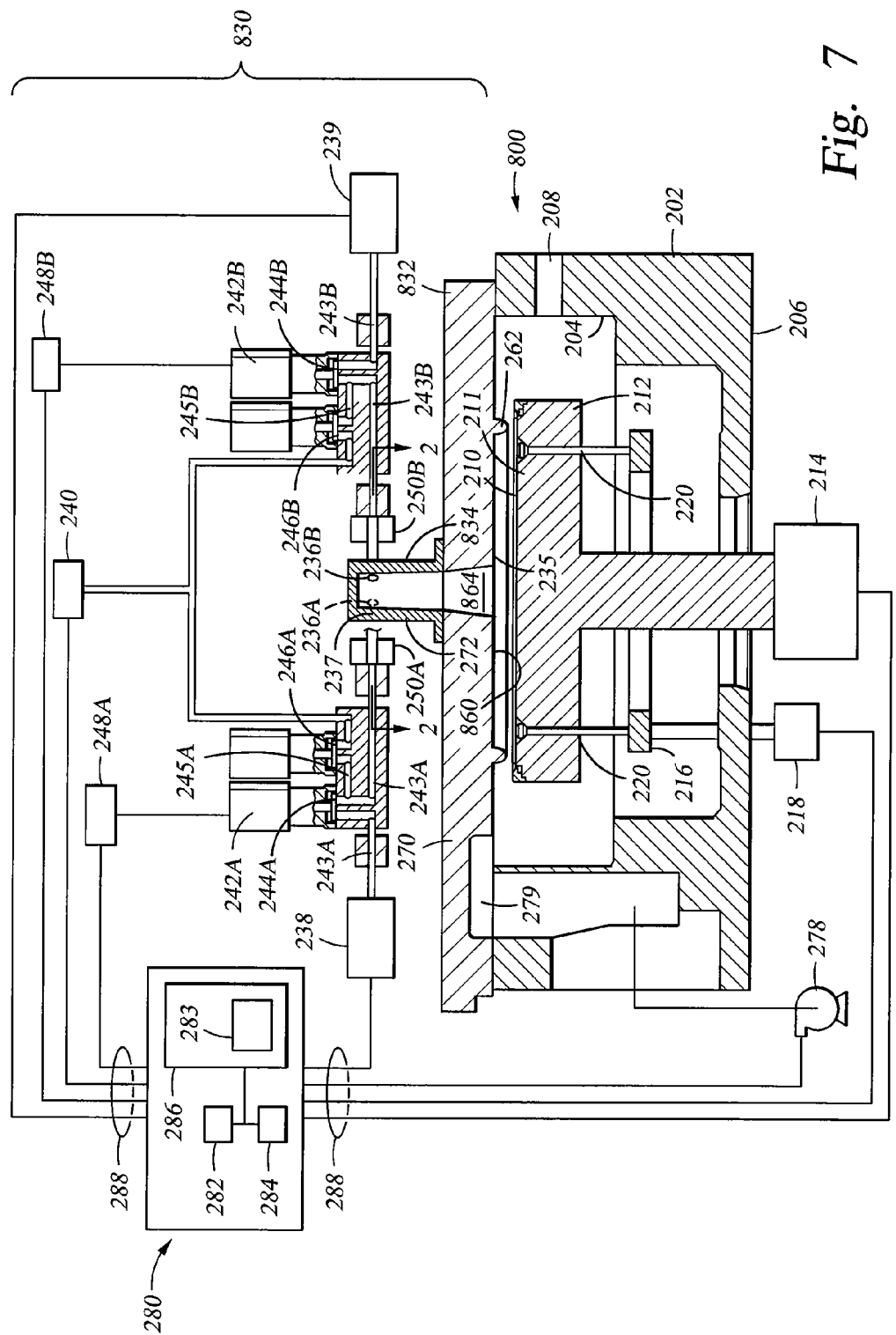
FIG. 7 is a schematic cross-sectional view of another embodiment of a chamber including a gas delivery apparatus adapted for atomic layer deposition.

For example, FIG. 7 shows another embodiment of a chamber 800 including a gas delivery apparatus 830 comprising a chamber lid 832 which provides a reaction zone 864 comprising a small volume and which provides an expanding channel 834. Some components of the chamber 800 are the same or similar to those described with reference to chamber 200 of FIG. 1, described above. Accordingly, like numbers have been used where appropriate. The chamber lid 832 comprises a bottom surface 860 that is substantially flat. In one embodiment, the spacing between the choke 262 and the substrate support 212 is between about 0.04 inches and about 2.0 inches, more preferably between about 0.04 inches and about 0.2 inches.

In another example, FIG. 8 shows another embodiment of a chamber 900 including a gas delivery apparatus 930 comprising a chamber lid 932 which provides a reaction zone 964 comprising a small volume and which provides a downwardly sloping or funnel shaped bottom surface 960. Some components of the chamber 900 are the same or similar to those described with reference to chamber 200 of FIG. 1, described above. Accordingly, like numbers have been used where appropriate. Gas sources 937 are coupled to the passageway 933 through one or more valves 941. In one aspect, the passageway 933 comprises a long length to reduce the likelihood that a gas introduced through valves 941 will blow off reactants adsorbed on the surface of the substrate 210.

The gas delivery apparatuses 230, 830, 930 of FIGS. 1-8 have been described above as comprising chamber lids 232, 832, 932 which act as the lid of the chamber body 202. Other embodiments of the chamber lids 232, 832, 932 comprises any covering member disposed over the substrate support 212 delineating a reaction zone 264, 864, 964 which lowers the volume in which a gas must flow during substrate processing. In other embodiments, instead of or in conjunction with the substrate support 212, the chamber lid 232, 832, 932 may be adapted to move up and down to adjust the volume of the reaction zone 264, 864, 964.

Figure 5:
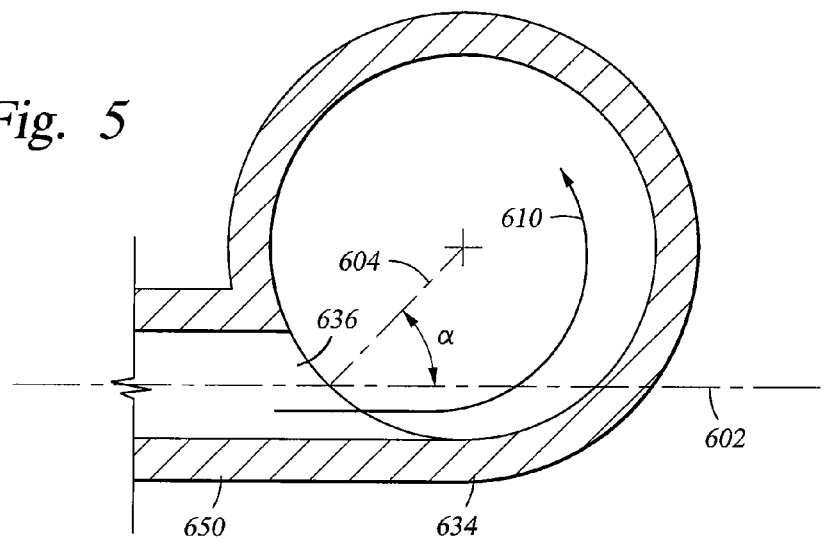
FIG. 5 is a top cross-sectional view of another embodiment of the expanding channel of the chamber lid which is adapted to receive a single gas flow.
Figure 6:
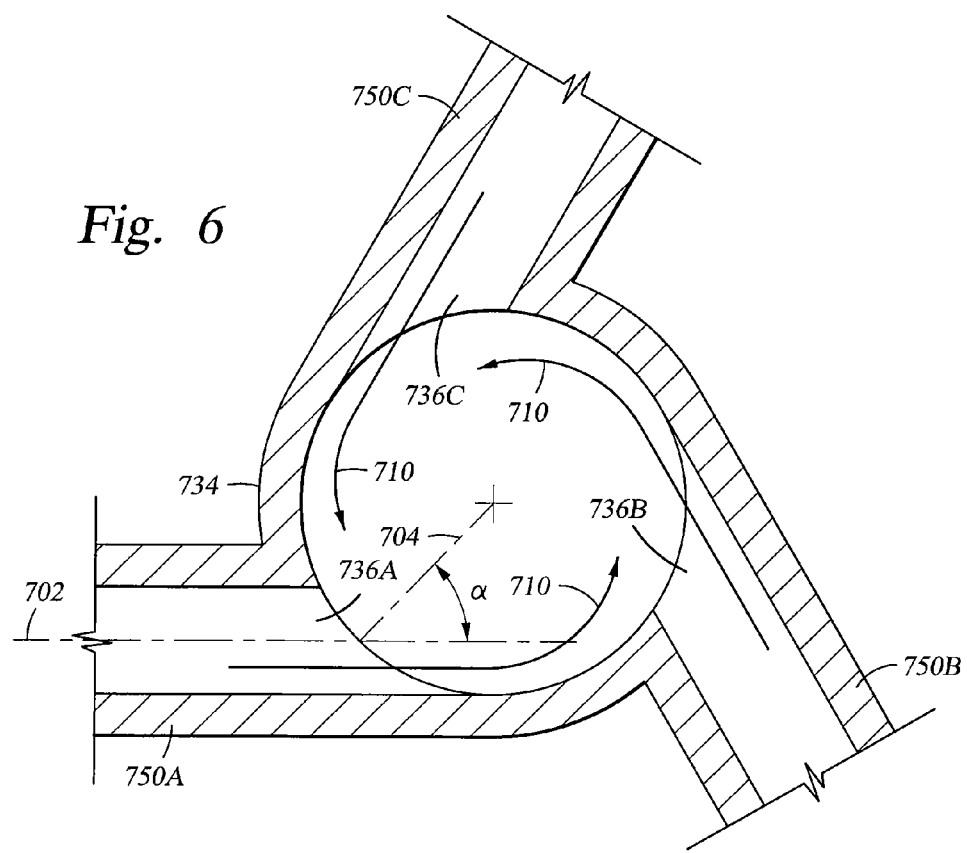
FIG. 6 is a top cross-sectional view of another embodiment of the expanding channel of the chamber lid which is adapted to receive three gas flows.

The gas delivery apparatus 230 of FIG. 1 has been described as including two pairs of valves 242A/252A, 242B/252B coupled to a reactant gas source 238, 239 and a purge gas source 240. In other embodiments, the gas delivery apparatus 230 may comprise one or more valves coupled to a single or a plurality of gas sources in a variety of configurations. FIGS. 1-3 show a chamber 200 adapted to provide two gas flows together or separately from two gas inlets 236A, 236B utilizing two pairs of valves 242A/252A, 242B/252B. FIG. 5 is a top cross-sectional view of another embodiment of an expanding channel 634 of the chamber lid 232 which is adapted to receive a single gas flow through one gas inlet 636 from one gas conduit 650 coupled to a single or a plurality of valves. The gas conduit 650 may be positioned at an angle α from the center line 602 of the gas conduit 650 and from a radius line 604 from the center of the expanding channel 634. The gas conduit 650 positioned at an angle α (i.e., when α>0°) causes a gas to flow in a circular direction as shown by arrow 610. FIG. 6 is a top cross-sectional view of another embodiment of an expanding channel 734 of the chamber lid 232 which is adapted to receive three gas flows together, partially together (i.e., two of three gas flows together), or separately through three gas inlets 736A, 736B, 736C from three gas conduits 750A, 750B, 750C in which each conduit is coupled to a single or a plurality of valves. The gas conduits 750A, 750B, 750C may be positioned at an angle α from the center line 702 of the gas conduits 750A, 750B, 750C and from a radius line 704 from the center of the expanding channel 734. The gas conduits 750A, 750B, 750C positioned at an angle α (i.e., when α>0°) causes a gas to flow in a circular direction as shown by arrows 710.

Embodiments of chambers 200, 800, 900 with gas delivery apparatuses 230, 830, 930 as described in FIGS. 1-8 may be used advantageously to implement atomic layer deposition processes of elements, which include but are not limited to, tantalum, titanium, tungsten, and copper, or to implement atomic layer deposition of compounds or alloys/combinations films, which include but are not limited to tantalum nitride, tantalum silicon nitride, titanium nitride, titanium silicon nitride, tungsten nitride, tungsten silicon nitride, and copper aluminum. Embodiments of chambers 200, 800, 900 with gas delivery apparatuses 230, 830, 930 as described in FIGS. 1-8 may also be used advantageously to implement chemical vapor deposition of various materials.

For clarity reasons, deposition of a layer by atomic layer deposition will be described in more detail in reference to the atomic layer deposition of a tantalum nitride layer utilizing chamber 200 as described in FIGS. 1-4. In one aspect, atomic layer deposition of a tantalum nitride barrier layer comprises sequentially providing pulses of a tantalum containing compound and pulses of a nitrogen containing compound to the process chamber 200 in which each pulse is separated by a flow of a purge gas and/or chamber evacuation to remove any excess reactants to prevent gas phase reactions of the tantalum containing compound with the nitrogen containing compound and to remove any reaction by-products. Sequentially providing a tantalum containing compound and a nitrogen containing compound may result in the alternating absorption of monolayers of a tantalum containing compound and of monolayers of a nitrogen containing compound to form a monolayer of tantalum nitride on a substrate structure for each cycle of pulses. The term substrate structure is used to refer to the substrate as well as other material layers formed thereover, such as a dielectric layer.

It is believed that the adsorption processes used to adsorb the monolayer of the reactants, such as the tantalum containing compound and the nitrogen containing compound, are self-limiting in that only one monolayer may be adsorbed onto the surface of the substrate structure during a given pulse because the surface of the substrate structure has a finite number of sites for adsorbing the reactants. Once the finite number of sites is occupied by the reactants, such as the tantalum containing compound or the nitrogen containing compound, further absorption of the reactants will be blocked. The cycle may be repeated to a desired thickness of the tantalum nitride layer.

Pulses of a tantalum containing compound, such as pentakis(dimethylamino) tantalum (PDMAT; $Ta(NMe_2)_5$), may be introduced by gas source 238 through valve 242A. The tantalum containing compound may be provided with the aid of a carrier gas, which includes, but is not limited to, helium (He), argon (Ar), nitrogen ($N_2$), hydrogen ($H_2$), and combinations thereof. Pulses of a nitrogen containing compound, such as ammonia, may be introduced by gas source 239 through valve 242A. A carrier gas may also be used to help deliver the nitrogen containing compound. A purge gas, such as argon, may be introduced by gas source 240 through valve 242A and/or through valve 242B. In one aspect, the flow of purge gas may be continuously provided by gas source 240 through valves 242A, 242B to act as a purge gas between the pulses of the tantalum containing compound and of the nitrogen containing compound and to act as a carrier gas during the pulses of the tantalum containing compound and the nitrogen containing compound. In one aspect, delivering a purge gas through two gas conduits 250A, 250B provides a more complete purge of the reaction zone 264 rather than a purge gas provided through one gas conduit 250A, 250B. In one aspect, a reactant gas may be delivered through one gas conduit 250A, 250B since uniformity of flow of a reactant gas, such as a tantalum containing compound or a nitrogen containing compound, is not as critical as uniformity of the purge gas due to the self-limiting absorption process of the reactants on the surface of substrate structures. In other embodiments, a purge gas may be provided in pulses. In other embodiments, a purge gas may be provided in more or less than two gas flows. In other embodiments, a tantalum containing gas may be provided in more than a single gas flow (i.e., two or more gas flows). In other embodiments, a nitrogen containing may be provided in more than a single gas flow (i.e., two or more gas flows).

Other examples of tantalum containing compounds, include, but are not limited to, other organometallic precursors or derivatives thereof, such as pentakis(ethylmethylamino) tantalum (PEMAT; $Ta(N(Et)Me)_5$), pentakis(diethylamino) tantalum (PDEAT; $Ta(NEt_2)_5$), and any and all derivatives of PEMAT, PDEAT, or PDMAT. Other tantalum containing compounds include without limitation TBTDET ($Ta(NEt_2)_3NC_4H_9$ or $C_{16}H_{39}N_4Ta$) and tantalum halides, for example $TaX_5$ where X is fluorine (F), bromine (Br) or chlorine (Cl), and/or derivatives thereof. Other nitrogen containing compounds may be used which include, but are not limited to, $N_xH_y$, with x and y being integers (e.g., hydrazine ($N_2H_4$)), dimethyl hydrazine (($CH_3)_2N_2H_2$), tertbutylhydrazine ($C_4H_9N_2H_3$), phenylhydrazine ($C_6H_5N_2H_3$), other hydrazine derivatives, a nitrogen plasma source (e.g., $N_2$, $N_2/H_2$, $NH_3$, or a $N_2H_4$ plasma), 2,2'-azotertbutane (($CH_3)_6C_2N_2$), ethylazide ($C_2H_5N_3$), and other suitable gases. Other examples of purge gases include, but are not limited to, helium (He), nitrogen ($N_2$), hydrogen ($H_2$), other gases, and combinations thereof.

The tantalum nitride layer formation is described as starting with the absorption of a monolayer of a tantalum containing compound on the substrate followed by a monolayer of a nitrogen containing compound. Alternatively, the tantalum nitride layer formation may start with the absorption of a monolayer of a nitrogen containing compound on the substrate followed by a monolayer of the tantalum containing compound. Furthermore, in other embodiments, a pump evacuation alone between pulses of reactant gases may be used to prevent mixing of the reactant gases.

The time duration for each pulse of the tantalum containing compound, the time duration for each pulse of the nitrogen containing compound, and the duration of the purge gas flow between pulses of the reactants are variable and depend on the volume capacity of a deposition chamber employed as well as a vacuum system coupled thereto. For example, (1) a lower chamber pressure of a gas will require a longer pulse time; (2) a lower gas flow rate will require a longer time for chamber pressure to rise and stabilize requiring a longer pulse time; and (3) a large-volume chamber will take longer to fill, longer for chamber pressure to stabilize thus requiring a longer pulse time. Similarly, time between each pulse is also variable and depends on volume capacity of the process chamber as well as the vacuum system coupled thereto. In general, the time duration of a pulse of the tantalum containing compound or the nitrogen containing compound should be long enough for absorption of a monolayer of the compound. In one aspect, a pulse of a tantalum containing compound may still be in the chamber when a pulse of a nitrogen containing compound enters. In general, the duration of the purge gas and/or pump evacuation should be long enough to prevent the pulses of the tantalum containing compound and the nitrogen containing compound from mixing together in the reaction zone.

Generally, a pulse time of about 1.0 second or less for a tantalum containing compound and a pulse time of about 1.0 second or less for a nitrogen containing compound are typically sufficient to adsorb alternating monolayers on a substrate structure. A time of about 1.0 second or less between pulses of the tantalum containing compound and the nitrogen containing compound is typically sufficient for the purge gas, whether a continuous purge gas or a pulse of a purge gas, to prevent the pulses of the tantalum containing compound and the nitrogen containing compound from mixing together in the reaction zone. Of course, a longer pulse time of the reactants may be used to ensure absorption of the tantalum containing compound and the nitrogen containing compound and a longer time between pulses of the reactants may be used to ensure removal of the reaction by-products.

During atomic layer deposition, the substrate 210 may be maintained approximately below a thermal decomposition temperature of a selected tantalum containing compound. An exemplary heater temperature range to be used with tantalum containing compounds identified herein is approximately between about 20° C. and about 500° C. at a chamber pressure less than about 100 Torr, preferably less than 50 Torr. When the tantalum containing gas is PDMAT, the heater temperature is preferably between about 100° C. and about 300° C., more preferably between about 175° C. and 250° C., and the chamber pressure is between about 1.0 Torr and about 5.0 Torr. In other embodiments, it should be understood that other temperatures and pressures may be used. For example, a temperature above a thermal decomposition temperature may be used. However, the temperature should be selected so that more than 50 percent of the deposition activity is by absorption processes. In another example, a temperature above a thermal decomposition temperature may be used in which the amount of decomposition during each precursor deposition is limited so that the growth mode will be similar to an atomic layer deposition growth mode.

One exemplary process of depositing a tantalum nitride layer by atomic layer deposition, in the process chamber 200 of FIGS. 1-4, comprises providing pulses of pentakis(dimethylamino) tantalum (PDMAT) from gas source 238 at a flow rate between about 100 sccm and about 1,000 sccm, preferably between about 100 sccm and about 400 sccm, through valve 242A for a pulse time of about 0.5 seconds or less, about 0.1 seconds or less, or about 0.05 seconds or less due the smaller volume of the reaction zone 264. Pulses of ammonia may be provided from gas source 239 at a flow rate between about 100 sccm and about 1,000 sccm, preferably between 200 sccm and about 600 sccm, through valve 242B for a pulse time of about 0.5 seconds or less, about 0.1 seconds or less, or about 0.05 seconds or less due to a smaller volume of the reaction zone 264. An argon purge gas at a flow rate between about 100 sccm and about 1,000 sccm, preferably, between about 100 sccm and about 400 sccm, may be continuously provided from gas source 240 through valves 242A, 242B. The time between pulses of the tantalum containing compound and the nitrogen containing compound may be about 0.5 seconds or less, about 0.1 seconds or less, or about 0.07 seconds or less due to the smaller volume of the reaction zone 264. It is believed that a pulse time of about 0.016 seconds or more is required to fill the reaction zone 264 with a reactant gas and/or a purge gas. The heater temperature preferably is maintained between about 100° C. and about 300° C. at a chamber pressure between about 1.0 Torr and about 5.0 Torr. This process provides a tantalum nitride layer in a thickness between about 0.5 Å and about 1.0 Å per cycle. The alternating sequence may be repeated until a desired thickness is achieved.

In one embodiment, the layer, such as a tantalum nitride layer, is deposited to a sidewall coverage of about 50 Å or less. In another embodiment, the layer is deposited to a sidewall coverage of about 20 Å or less. In still another embodiment, the layer is deposited to a sidewall coverage of about 10 Å or less. A tantalum nitride layer with a thickness of about 10 Å or less is believed to be a sufficient thickness in the application as a barrier layer to prevent copper diffusion. In one aspect, a thin barrier layer may be used to advantage in filling submicron (e.g., less than 0.15 µm) and smaller features having high aspect ratios (e.g., greater than 5 to 1). Of course, a layer having a sidewall coverage of greater than 50 Å may be used.

Embodiments of atomic layer deposition have been described above as absorption of a monolayer of reactants on a substrate. The present invention also includes embodiments in which the reactants are deposited to more or less than a monolayer. The present invention also includes embodiments in which the reactants are not deposited in a self-limiting manner. The present invention also includes embodiments in which deposition occurs in mainly a chemical vapor deposition process in which the reactants are delivered sequentially or simultaneously.

Embodiments of atomic layer deposition have been described above as the deposition of the binary compound of tantalum nitride utilizing pulses of two reactants. In the deposition of other elements or compounds, pulses of two or more reactants may also be used.

While foregoing is directed to the preferred embodiment of the present invention, other and further embodiments of the invention may be devised without departing from the basic scope thereof, and the scope thereof is determined by the claims that follow.

The invention claimed is:

1. A lid for a processing chamber, comprising:
   a gradually expanding channel at a central portion of the lid;
   a tapered bottom surface extending from the gradually expanding channel to a peripheral portion of the chamber lid;
   a first conduit coupled to a first gas inlet within the gradually expanding channel; and a second conduit coupled to a second gas inlet within the gradually expanding channel, wherein the first conduit and the second conduit are positioned to provide a gas flow selected from the group of vortex, helix, and spiral through the gradually expanding channel.

2. The lid of claim 1, further comprising a temperature control element.

3. The lid of claim 1, wherein the first and second conduits are positioned to direct a gas flow toward a surface of the gradually expanding channel.

4. The lid of claim 3, wherein the tapered bottom surface is tapered in a straight, convex, or concave manner, or a combination thereof.

5. The lid of claim 1, wherein the tapered bottom surface is tapered in a straight, convex, or concave manner, or a combination thereof.

6. The lid of claim 1, wherein the tapered bottom surface has a funnel shape.

7. The lid of claim 1, further comprising a plate portion coupled to a cap portion, wherein the plate portion and the cap portion together form the gradually expanding channel.

8. The lid of claim 7, wherein the plate portion defined the tapered bottom surface.

9. A chamber for processing substrates, comprising:
a chamber lid, comprising:
a gradually expanding channel at a central portion of the chamber lid;
a tapered bottom surface extending from the gradually expanding channel to a peripheral portion of the chamber lid;
a first conduit coupled to a first gas inlet within the gradually expanding channel; and
a second conduit coupled to a second gas inlet within the gradually expanding channel, wherein the first conduit and the second conduit are positioned to provide a gas flow selected from the group of vortex, helix, and spiral through the gradually expanding channel.

10. The chamber of claim 9, further comprising a heated substrate support.

11. The chamber of claim 10, wherein a first valve is coupled to the first conduit and a second valve is coupled to the second conduit, and the first and second valves enable an atomic layer deposition process with a pulse time of about 1 second or less.

12. The chamber of claim 9, wherein a first valve is coupled to the first conduit and a second valve is coupled to the second conduit, and the first and second valves enable an atomic layer deposition process with a pulse time of about 1 second or less.

13. The chamber of claim 12, wherein a first gas source is in fluid communication with the first conduit and the first valve, and a second gas source is in fluid communication with the second conduit and the second valve.

14. The chamber of claim 9, wherein the chamber lid further comprises a heating element.

* * * * *